US010431495B1

(12) United States Patent
Cheng et al.

(10) Patent No.: US 10,431,495 B1
(45) Date of Patent: Oct. 1, 2019

(54) SEMICONDUCTOR DEVICE WITH LOCAL CONNECTION

(71) Applicant: INTERNATIONAL BUSINESS MACHINES CORPORATION, Armonk, NY (US)

(72) Inventors: Kangguo Cheng, Schenectady, NY (US); Lawrence A. Clevenger, Saratoga Springs, NY (US); Carl Radens, LaGrangeville, NY (US); Junli Wang, Slingerlands, NY (US); John H. Zhang, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/042,561

(22) Filed: Jul. 23, 2018

(51) Int. Cl.
H01L 21/768 (2006.01)
H01L 29/66 (2006.01)
H01L 21/8238 (2006.01)
H01L 27/092 (2006.01)

(52) U.S. Cl.
CPC .. *H01L 21/76897* (2013.01); *H01L 21/76895* (2013.01); *H01L 21/823835* (2013.01); *H01L 27/092* (2013.01); *H01L 29/665* (2013.01)

(58) Field of Classification Search
CPC ......... H01L 21/76897; H01L 21/76895; H01L 27/092; H01L 29/665; H01L 21/823835
See application file for complete search history.

(56) References Cited

U.S. PATENT DOCUMENTS

| 5,953,614 | A  | * | 9/1999 | Liu .................... H01L 21/76897 |
|           |    |   |        | 438/303                              |
| 8,564,030 | B2 |   | 10/2013 | Schultz                             |
| 9,006,100 | B2 |   | 4/2015 | Rashed et al.                       |
| 9,299,795 | B2 | * | 3/2016 | Guo ...................... H01L 29/665 |
| 9,496,361 | B1 | * | 11/2016 | Tung ................... H01L 29/4958 |
| 9,780,178 | B2 |   | 10/2017 | Xie et al.                          |
| 9,818,651 | B2 |   | 11/2017 | Bouche et al.                       |
| 9,824,921 | B1 |   | 11/2017 | Labonte et al.                      |
| 2008/0079090 | A1 |   | 4/2008 | Hwang et al.                        |
| 2011/0227170 | A1 | * | 9/2011 | Zhu ...................... H01L 29/1054 |
|           |    |   |        | 257/410                              |
| 2012/0104514 | A1 | * | 5/2012 | Park .................. H01L 21/28518 |
|           |    |   |        | 257/411                              |

(Continued)

OTHER PUBLICATIONS

Kangguo Cheng et al., "Semiconductor Device With Local Connection," Related Application, U.S. Appl. No. 16/042,585, filed Jul. 23, 2018.

(Continued)

*Primary Examiner* — John P. Dulka
(74) *Attorney, Agent, or Firm* — Cantor Colburn LLP; Grant Johnson

(57) ABSTRACT

A technique relates to a semiconductor device. A first trench silicide (TS) is coupled to a first source or drain (S/D). A second TS is coupled to a second S/D, and a gate metal is separated from the first and second TS. A trench is formed above and on sides of the gate metal. A local connection metal is formed in the trench such that the gate metal is coupled to the first TS and the second TS. A local connection cap is formed on top of the local connection metal.

20 Claims, 33 Drawing Sheets

(56) References Cited

U.S. PATENT DOCUMENTS

| | | | | |
|---|---|---|---|---|
| 2013/0005133 | A1* | 1/2013 | Lee | H01L 29/66545 438/595 |
| 2013/0043516 | A1* | 2/2013 | Han | H01L 21/76802 257/288 |
| 2013/0240990 | A1* | 9/2013 | Yin | H01L 29/456 257/343 |
| 2013/0320412 | A1* | 12/2013 | Yamasaki | H01L 21/823842 257/288 |
| 2014/0103403 | A1* | 4/2014 | Kim | H01L 21/76801 257/288 |
| 2015/0060960 | A1* | 3/2015 | Xie | H01L 29/785 257/288 |
| 2015/0221733 | A1* | 8/2015 | Hsieh | H01L 29/66734 257/331 |
| 2015/0270176 | A1* | 9/2015 | Xie | H01L 21/76885 257/384 |
| 2016/0358916 | A1* | 12/2016 | Adusumilli | H01L 27/092 |
| 2016/0365424 | A1* | 12/2016 | Basker | H01L 29/665 |
| 2016/0372332 | A1* | 12/2016 | Pranatharthiharan | H01L 23/5226 |
| 2017/0263557 | A1 | 9/2017 | Clevenger et al. | |
| 2017/0263715 | A1* | 9/2017 | Bouche | H01L 29/401 |
| 2018/0012887 | A1* | 1/2018 | Labonte | H01L 21/31053 |
| 2018/0047737 | A1* | 2/2018 | Chuang | H01L 21/28273 |
| 2018/0233417 | A1* | 8/2018 | Pranatharthiharan | H01L 29/66545 |

OTHER PUBLICATIONS

List of IBM Patents or Patent Applications Treated As Related, (Appendix P), Filed Jul. 23, 2018; pp. 1-2.

M. Carmona et al., "Study of gate contact over active area," 29th Symposium on Microelectronics Technology and Devices (SBMicro), 2014, 4 pages.

* cited by examiner

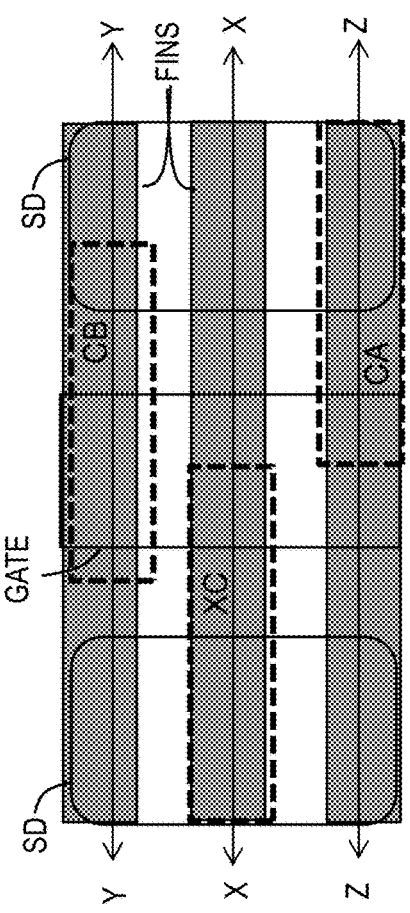
FIG. 9A 900
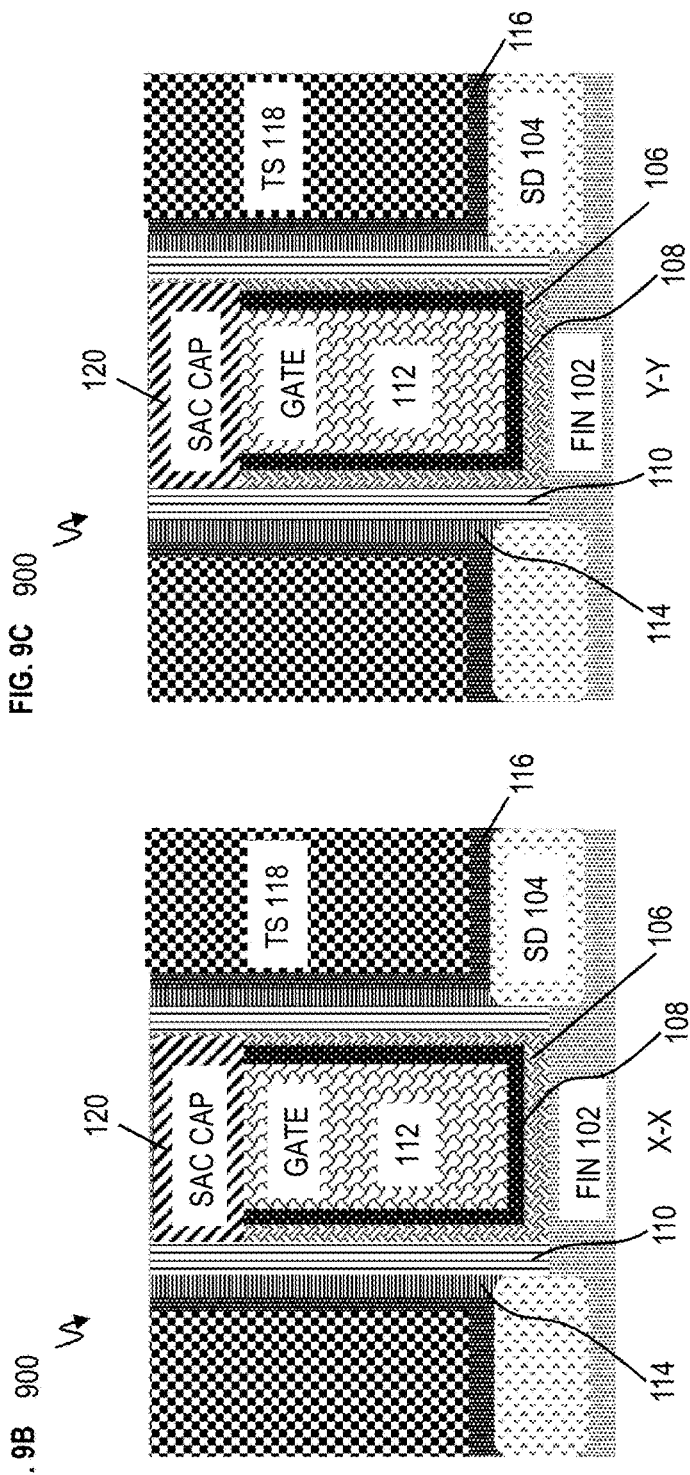
FIG. 9C 900
FIG. 9B 900

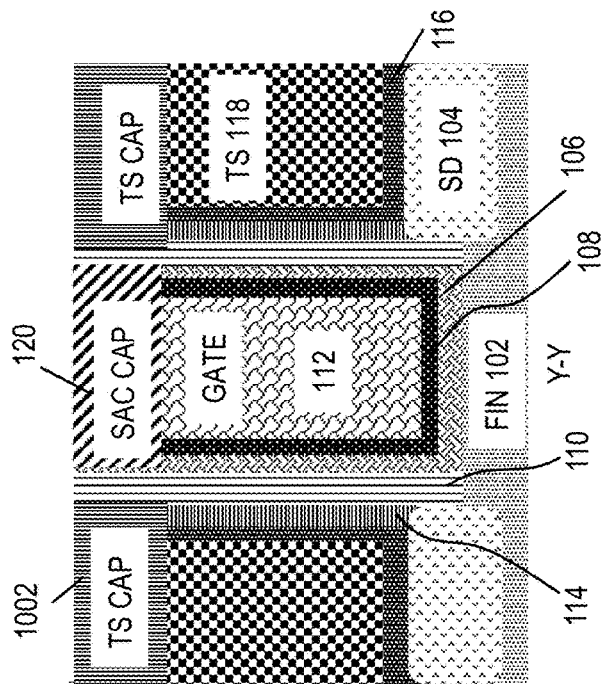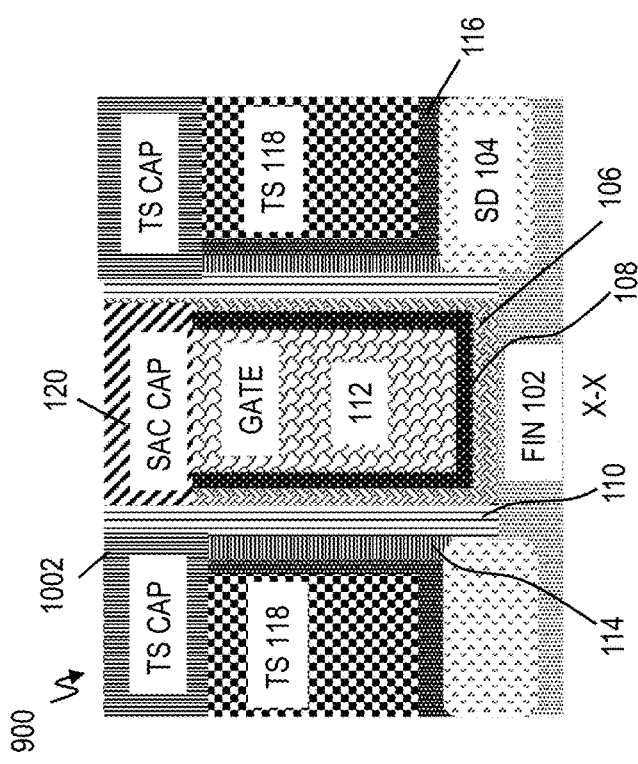

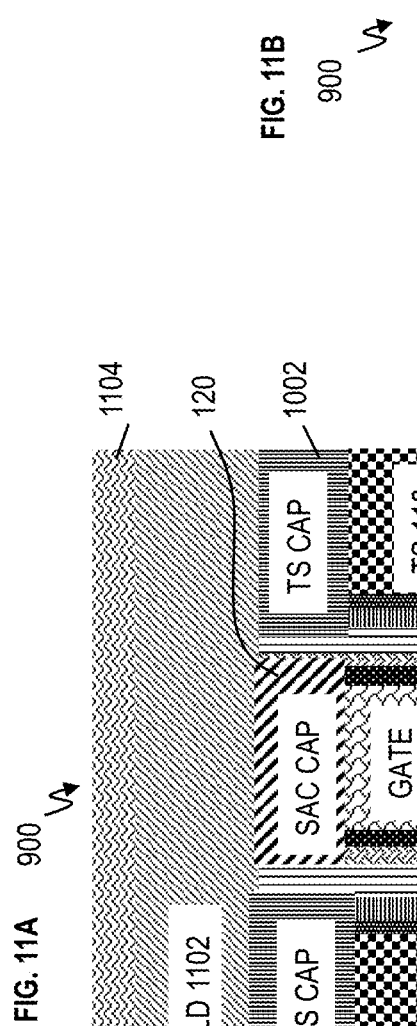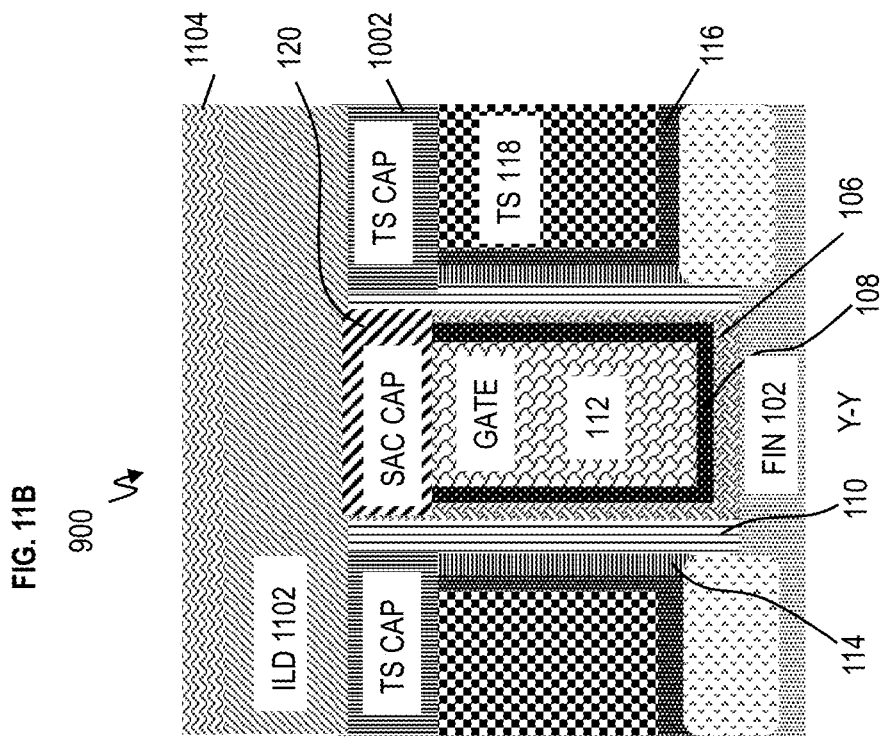

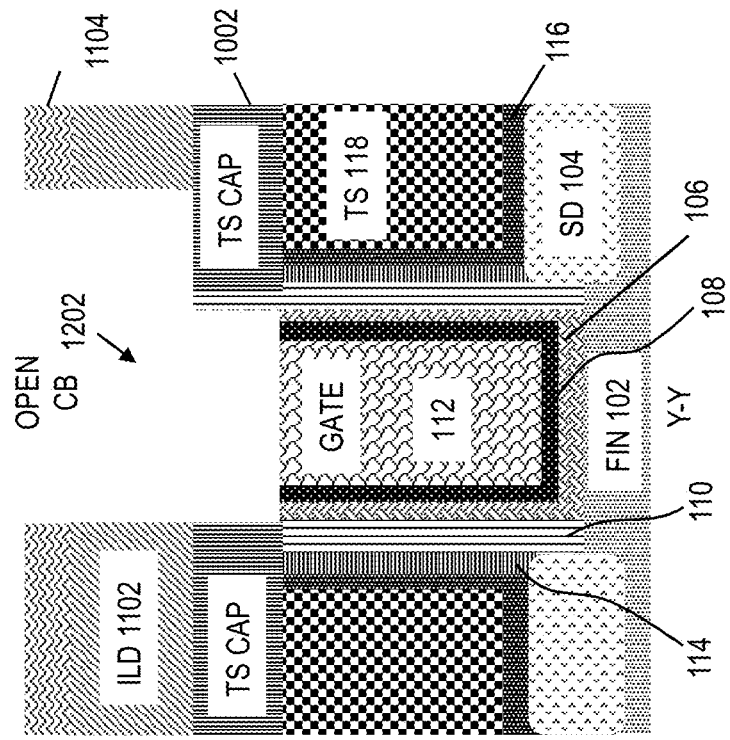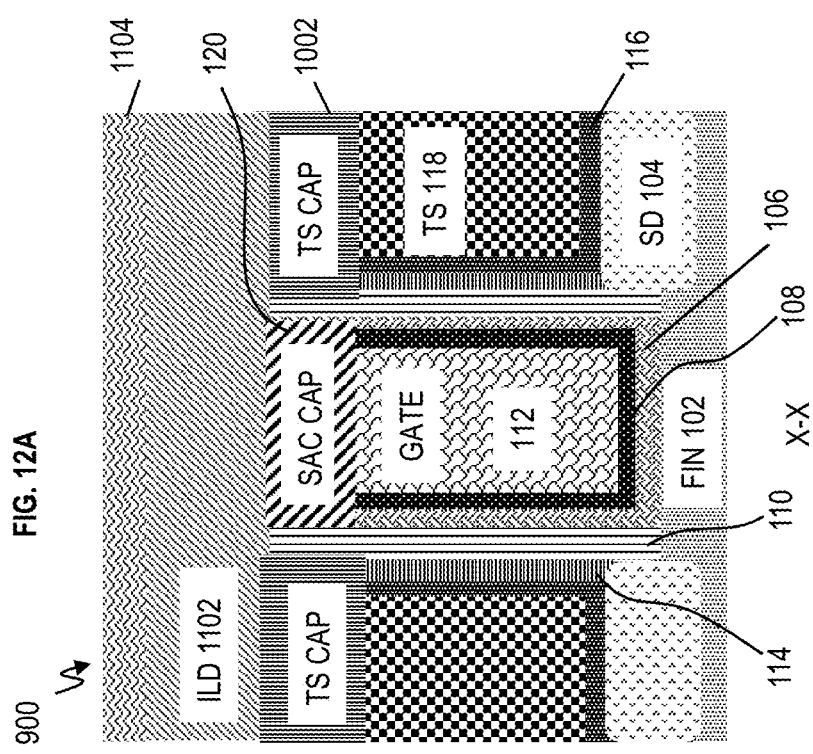

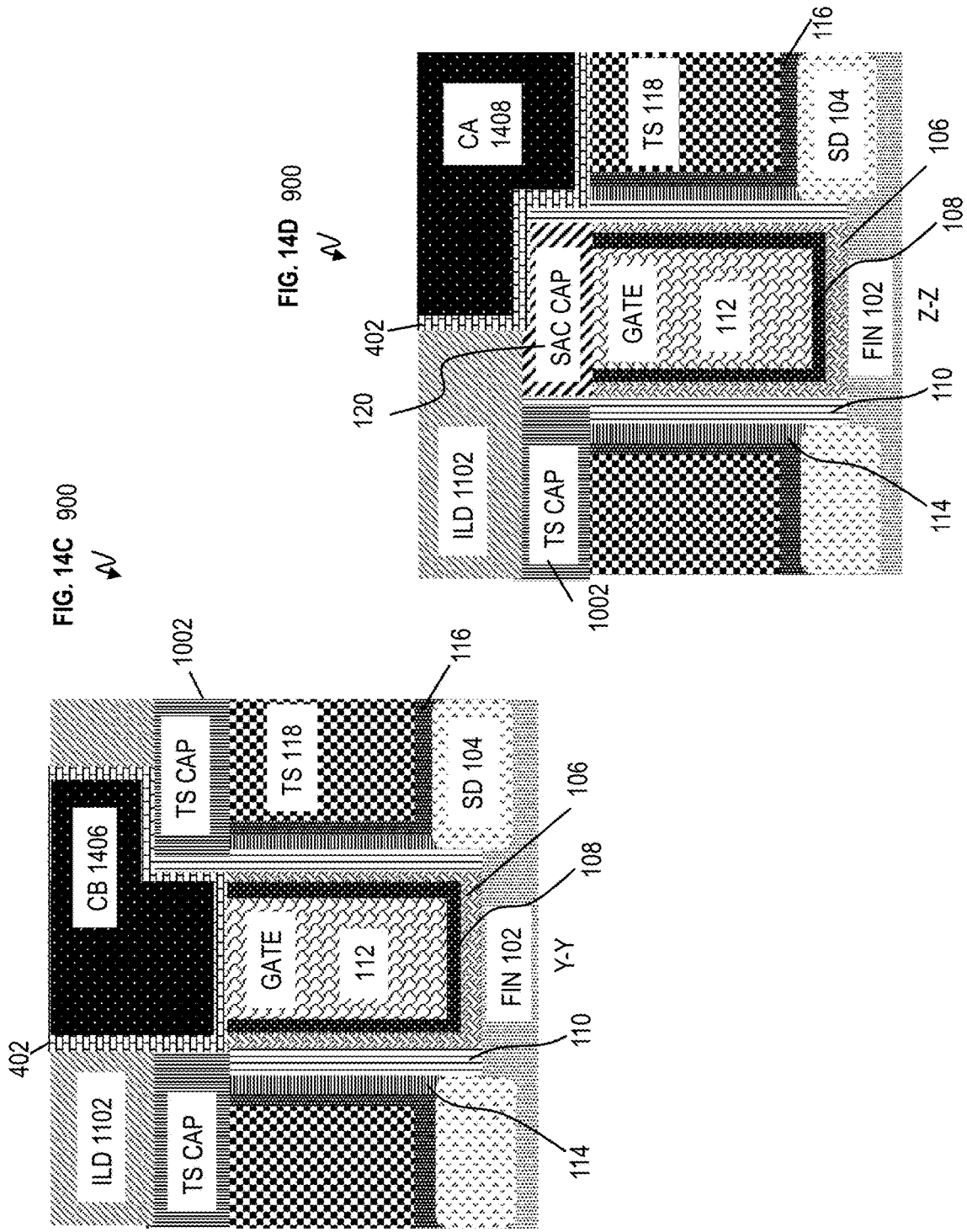

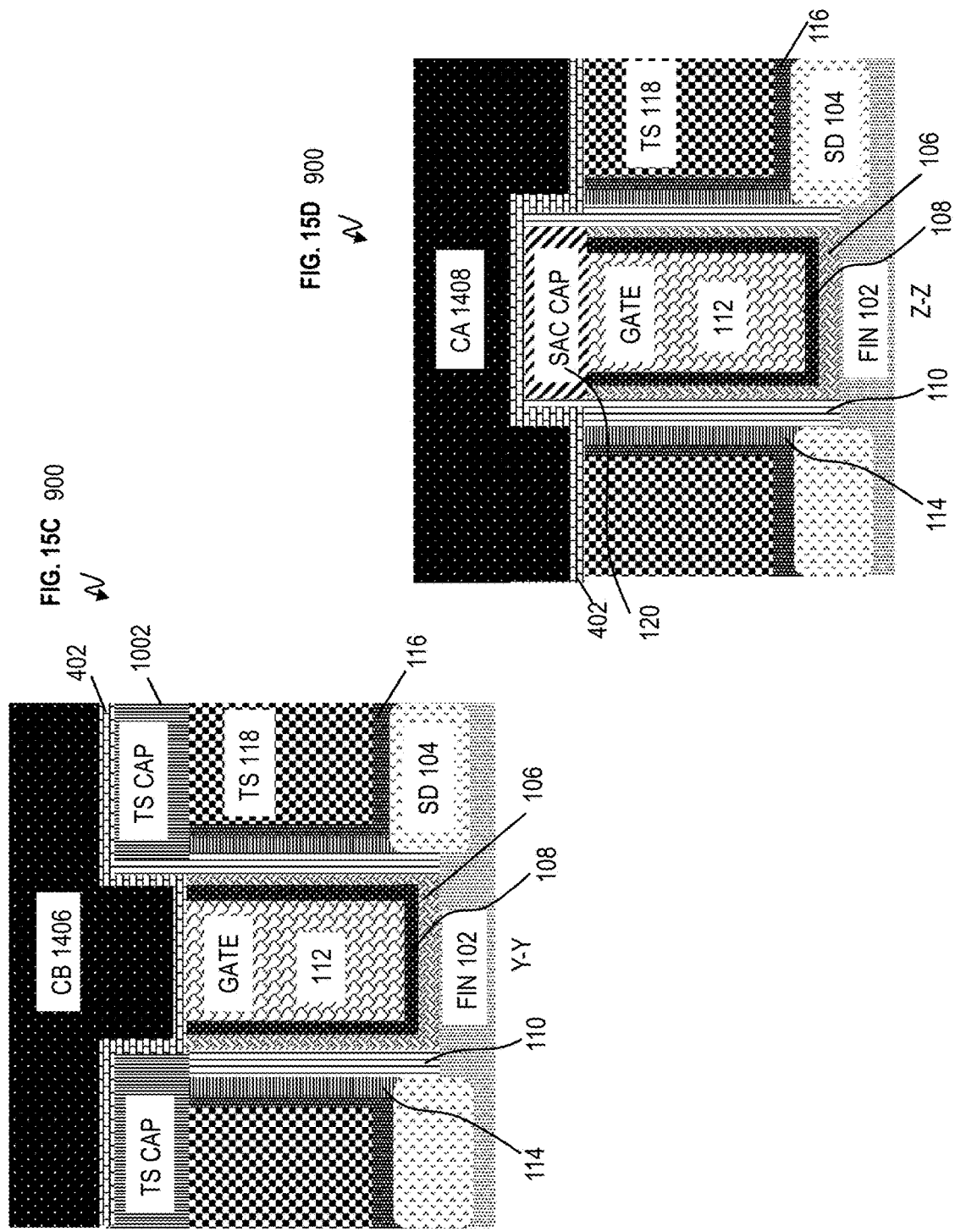

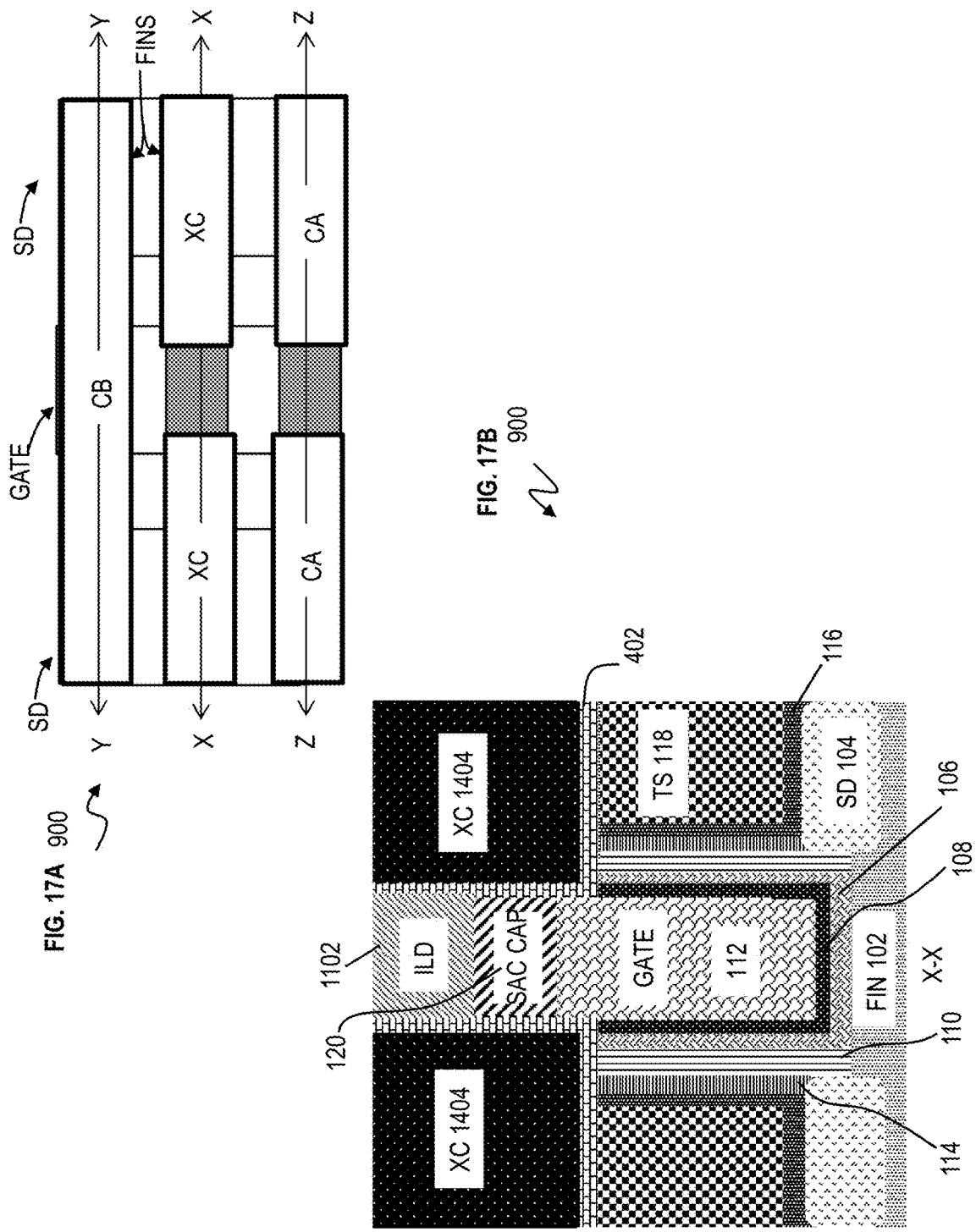

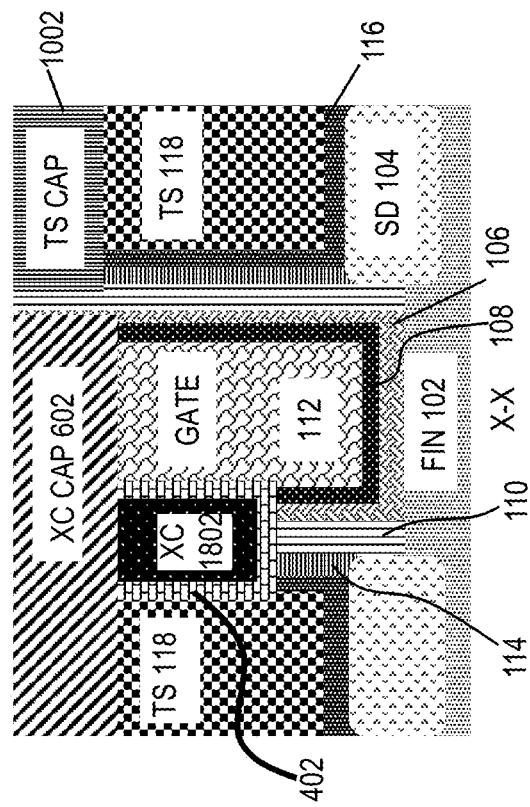
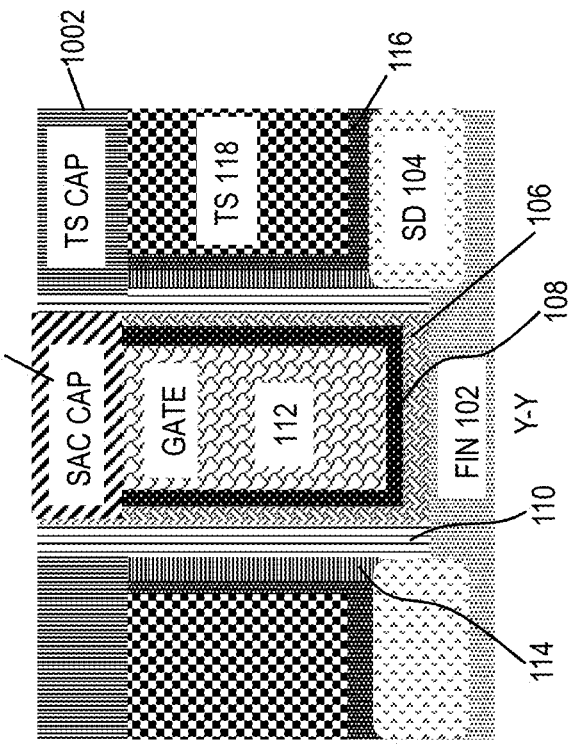

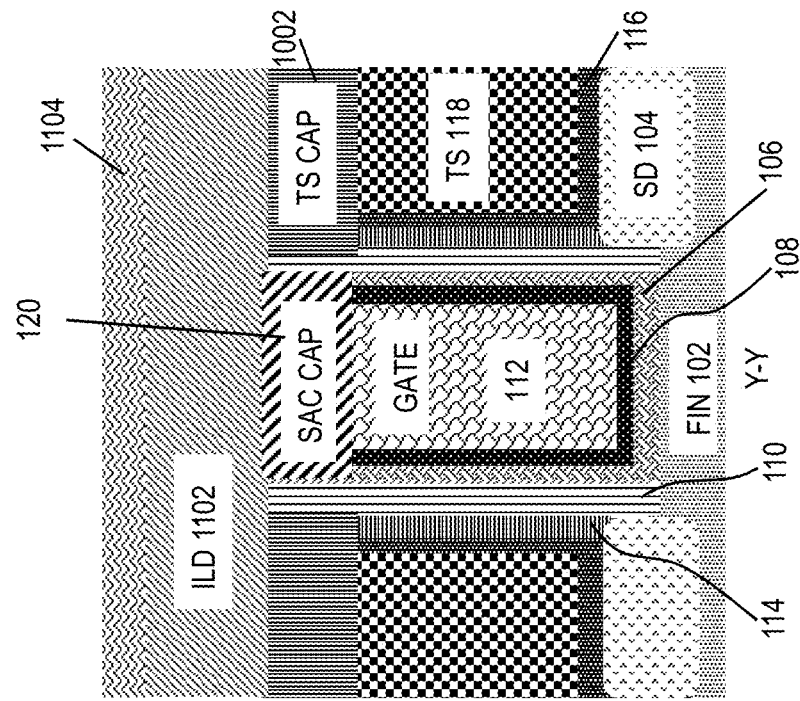
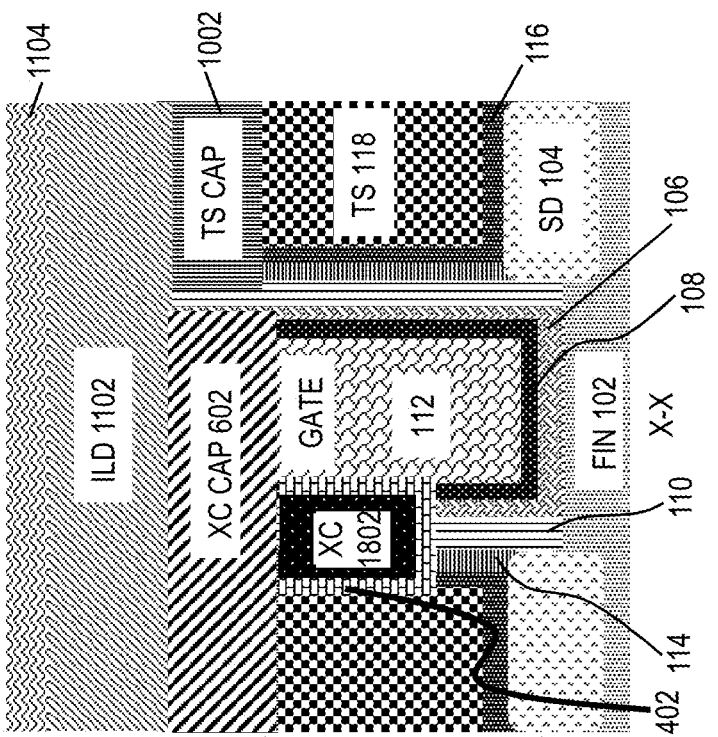
FIG. 20A
FIG. 20B

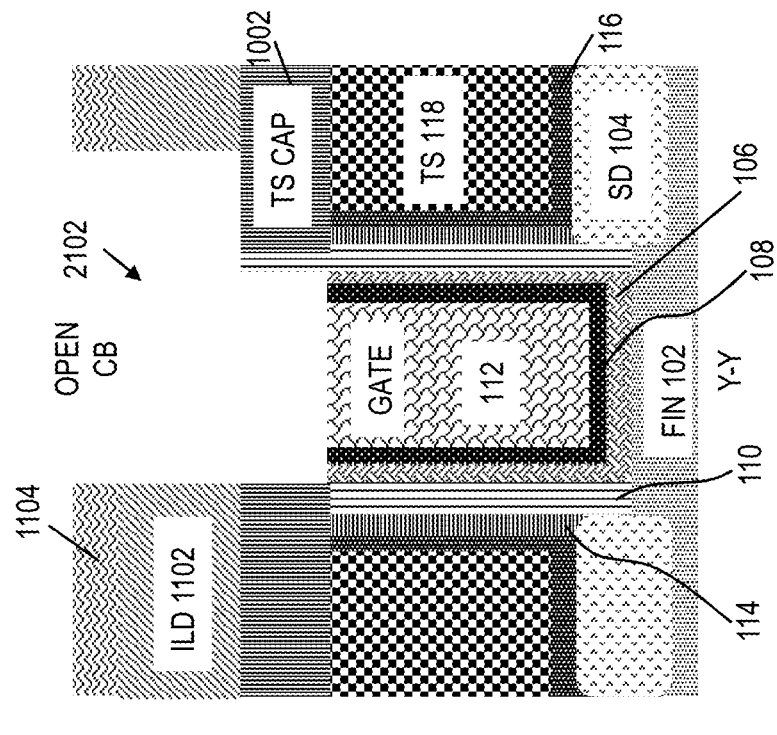
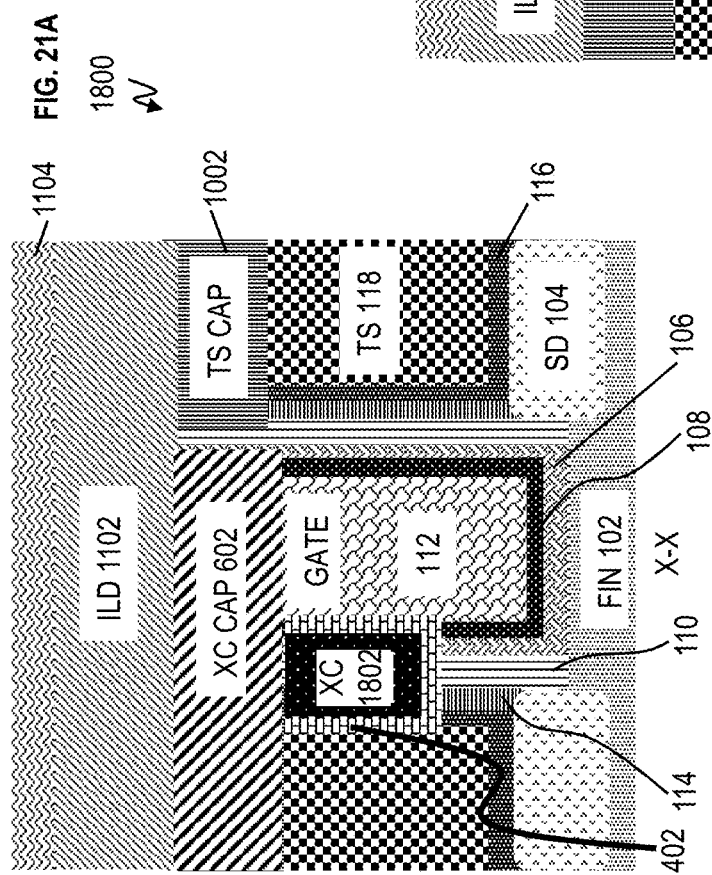

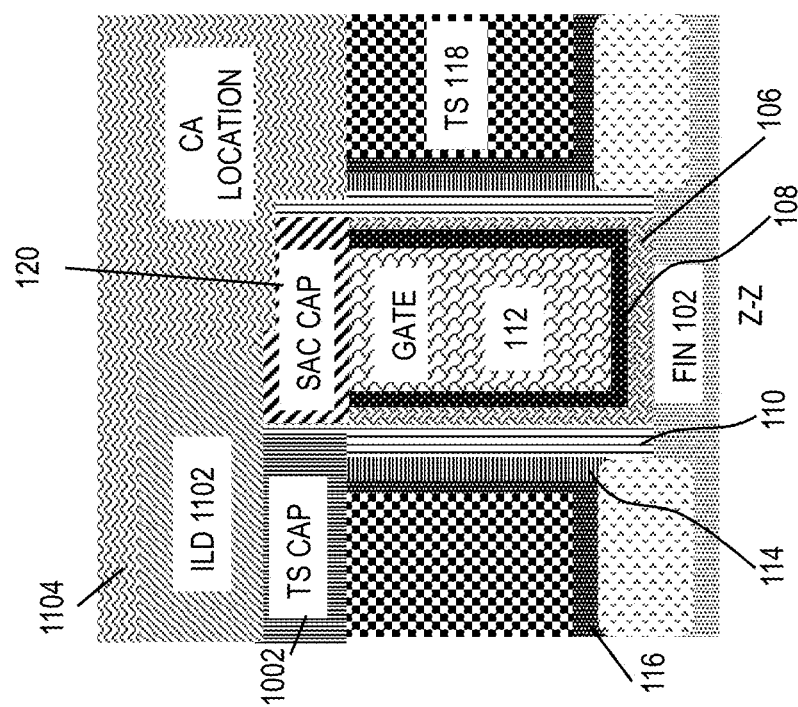

SEMICONDUCTOR DEVICE WITH LOCAL CONNECTION

BACKGROUND

The present invention generally relates to fabrication methods and resulting structures for semiconductor devices, and more specifically, to a semiconductor device with a local connection.

A metal-oxide-semiconductor field-effect transistors (MOSFET) is used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

SUMMARY

Embodiments of the invention are directed to a method for forming a semiconductor device. A non-limiting example of the method includes forming a first trench silicide (TS) coupled to a first source or drain (S/D), a second TS coupled to a second S/D, and a gate metal separated from the first and second TS. The method includes forming a trench above and on sides of the gate metal and forming a local connection metal in the trench such that the gate metal is coupled to the first TS and the second TS. Also, the method includes forming a local connection cap on top of the local connection metal.

Embodiments of the invention are directed to a method for forming a semiconductor device. A non-limiting example of the method includes forming a first trench silicide (TS) coupled to a first source or drain (S/D), a second TS coupled to a second S/D, a gate metal separated from the first and second TS, and a local connection cap over the gate metal. The method includes recessing the first and second TS, forming a first TS cap on the first TS and a second TS cap on the second TS, and forming an inter-level dielectric (ILD) on top of the local connection cap, the first TS, and the second TS. Also, the method includes forming a local connection opening, a gate contact opening, and a S/D contact opening. The method includes depositing a local connection metal in the local connection opening, a gate metal contact in the gate contact opening, and a S/D metal contact in the S/D contact opening, wherein the local connection metal, the gate metal contact, and the S/D metal contact are separate from each other.

Embodiments of the invention are directed to a method for forming a semiconductor device. A non-limiting example of the method includes providing a first trench silicide (TS) coupled to a first source or drain (S/D), a second TS coupled to a second S/D, a local connection metal coupled to a gate metal and the first TS, and a local connection cap over the gate metal. The method includes recessing the first and second TS to form a first TS cap on the first TS and a second TS cap on the second TS. The method includes forming an inter-level dielectric (ILD) on top of the local connection cap, the first TS, and the second TS. Also, the method includes forming a gate contact opening and a S/D contact opening and depositing a gate metal contact in the gate contact opening and a S/D metal contact in the S/D contact opening, wherein the local connection metal is separated from the S/D metal contact over a first fin of the semiconductor device.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 9A depicts a simple diagram of a top view of a semiconductor device after an initial set of fabrication operations according to embodiments of the invention;

FIG. 9B depicts a cross-sectional view of the semiconductor device taken along line X-X in FIG. 9A according to embodiments of the invention;

FIG. 9C depicts a cross-sectional view of the semiconductor device taken along line Y-Y in FIG. 9A according to embodiments of the invention;

FIG. 10A depicts a cross-sectional view of the semiconductor device taken along line X-X in FIG. 9A after fabrication operations according to embodiments of the invention;

FIG. 10B depicts a cross-sectional view of the semiconductor device taken along line Y-Y in FIG. 9A after fabrication operations according to embodiments of the invention;

FIG. 11A depicts a cross-sectional view of the semiconductor device taken along line X-X in FIG. 9A after fabrication operations according to embodiments of the invention;

FIG. 11B depicts a cross-sectional view of the semiconductor device taken along line Y-Y in FIG. 9A after fabrication operations according to embodiments of the invention;

FIG. 12A depicts a cross-sectional view of the semiconductor device taken along line X-X in FIG. 9A after fabrication operations according to embodiments of the invention;

FIG. 12B depicts a cross-sectional view of the semiconductor device taken along line Y-Y in FIG. 9A after fabrication operations according to embodiments of the invention;

FIG. 14C depicts a cross-sectional view of the semiconductor device taken along line Y-Y in FIG. 14A according to embodiments of the invention;

FIG. 14D depicts a cross-sectional view of the semiconductor device taken along line Z-Z in FIG. 14A according to embodiments of the invention.

FIG. 15C depicts a cross-sectional view of the semiconductor device taken along line Y-Y in FIG. 15A according to embodiments of the invention;

FIG. 15D depicts a cross-sectional view of the semiconductor device taken along line Z-Z in FIG. 15A according to embodiments of the invention;

FIG. 17A depicts a simple diagram of a top view of the semiconductor device after fabrication operations according to embodiments of the invention;

FIG. 17B depicts a cross-sectional view of the semiconductor device taken along line X-X in FIG. 17A according to embodiments of the invention;

FIG. 19A depicts a cross-sectional view of the semiconductor device taken along line X-X in FIG. 18A after fabrication operations according to embodiments of the invention;

FIG. 19B depicts a cross-sectional view of the semiconductor device taken along line Y-Y in FIG. 18A after fabrication operations according to embodiments of the invention;

FIG. 20A depicts a cross-sectional view of the semiconductor device taken along line X-X in FIG. 18A after fabrication operations according to embodiments of the invention;

FIG. 20B depicts a cross-sectional view of the semiconductor device taken along line Y-Y in FIG. 18A after fabrication operations according to embodiments of the invention;

FIG. 21A depicts a cross-sectional view of the semiconductor device taken along line X-X in FIG. 18A after fabrication operations according to embodiments of the invention;

FIG. 21B depicts a cross-sectional view of the semiconductor device taken along line Y-Y in FIG. 18A after fabrication operations according to embodiments of the invention;

FIG. 21C depicts a cross-sectional view of the semiconductor device taken along line Z-Z in FIG. 18A according to embodiments of the invention;

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, many local connections between gate and trench silicide are required for logical, analog, digital, and memory circuits. The local connection is referred to as an XC connection. As technology continues to shrink, the XC connection requires a critical hard mask open and presents a potential issue for short circuiting with other type connections or contacts. Particularly, there can be an issue of a gate and trench silicide short.

Turning now to an overview of the aspects of the invention, one or more embodiments of the invention provide semiconductor devices and a method of forming the semiconductor devices. Embodiments of the invention provide methods and structures of forming self-aligned embedded XC connections with recess spacers (e.g., local connection cap and/or trench silicide cap) to address issues above.

Figure 1:
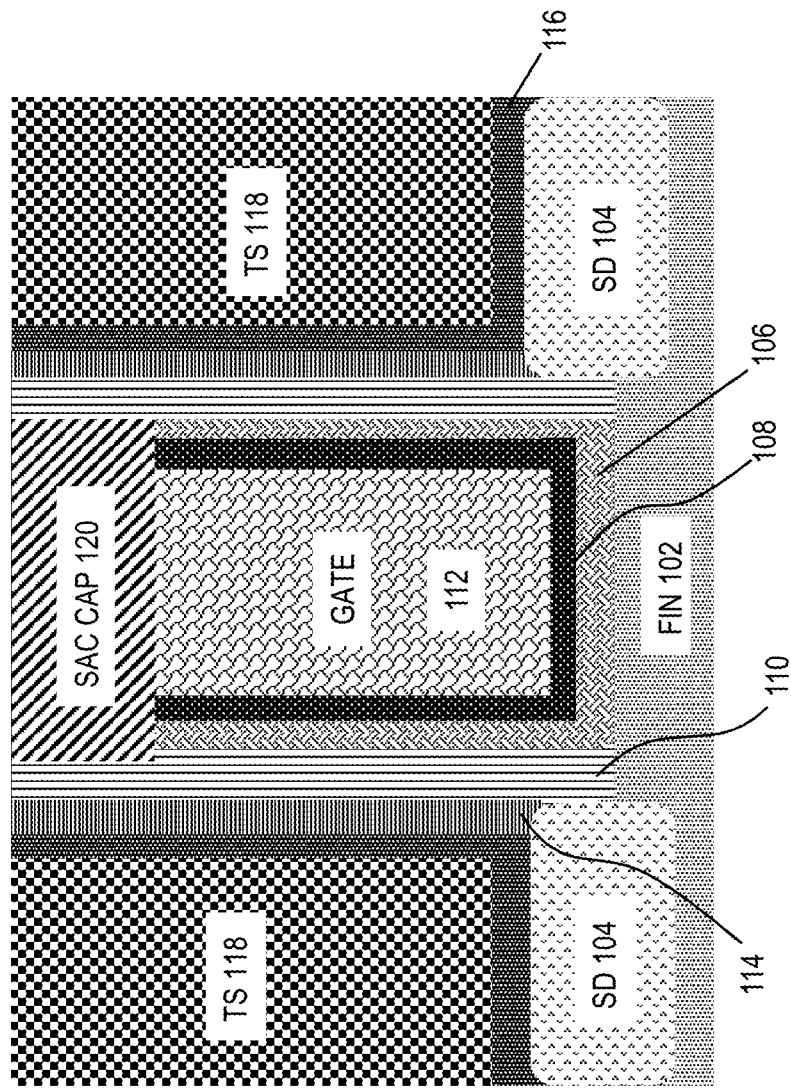
FIG. 1 depicts a cross-sectional view of a semiconductor device along a fin length after an initial set of fabrication operations according to embodiments of the invention.

Turning now to a more detailed description of aspects of the present invention, FIG. 1 depicts a cross-sectional view of a semiconductor device 100. FIG. 1 is a view illustrating the fin length. After initial fabrication processing, the semiconductor device 100 includes a fin 102 with source and drain (SD) regions 104 formed on both sides of the fin 102. The fin 102 is a semiconductor material. The fin 102 can be a silicon substrate, although other materials can be used as the fin 102. The source/drain region 104 can be epitaxially grown from the fin 102 and is a semiconductor material. The source/drain region 104 can be doped with P-type dopants or N-type dopants as desired. A gate structure is formed and the gate includes one or more high-k dielectric materials 106, one or more work function metals 108 formed on the high-k dielectric material 106, and a gate metal 112 formed on the work function metal 108. A gate spacer material 110 is formed on the sides of the high-k dielectric material 106. The gate spacer material 110 can be, for example, an oxide such as silicon dioxide, a nitride such as silicon nitride, etc.

The high-k dielectric material 106 can include one or more high-k materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include a dopant such as lanthanum or aluminum. High-k dielectric materials can have a dielectric constant greater than 3.9, 7.0, or 10.0.

The work function metal 108 can include one or more work function metals. The work function metal 108 can include P-type metals used for PFETs and N-type metals used for NFETs. Example work function metals can include TiN, TiC, TiCAl, TaN, or any other metals used in the state of the art. The gate metal 112 can include the example work function metals discussed herein and/or other metals including aluminum, copper, etc. The high-k dielectric material 106, the work function metal 108, and the gate metal 112 together form a gate stack or gate structure.

A liner 114 is formed on the sides of the gate spacer material 110 and on the S/D regions 104. The liner 114 is a non-conductive material. The liner 114 can be, for example, silicon nitride. Other examples materials of the liner 114 can include SiOCN, SiBCN, SiC, SiOC, SiCN, BN, SiON, and combinations thereof A first metal liner 116 is formed on the liner 114 and the S/D 104. Example materials of the first metal liner 116 can include titanium nitride (TiN), tantalum nitride (TaN), hafnium nitride (HfN), niobium nitride (NbN), tungsten nitride (WN), or combinations thereof. A silicide or trench silicide (TS) 118 is formed on the first metal liner 116 to be over the S/D 104. The trench silicide 118 is a conductive material. Example materials of the trench silicide 118 can include TiSix, WSix, CoSix, AlSix etc A gate (or SAC) cap 120 is formed on top of the high-k dielectric material 106, the work function metal 108, and the gate metal 112 (which form the gate structure). The gate cap 120 is an insulator or very poor conductor, and the gate cap 120 can be an undoped dielectric material, such as, silicon nitride. Other example materials for the gate cap 120 can include SiOCN, SiOC, SiC, SIBCN, SiCN, BN, SiON, and combinations thereof.

It should be appreciated that a replacement metal gate process is utilized to form the gate metal 112. Following process of record (POR) to form the replacement metal gate 112, the following can done: perform a metal gate 112 recess, fill with insulator such as SiN and CMP to stop on field oxide, perform source/drain contacts open (e.g., RIE), fill with metal liner 116 and metal 118 and then CMP metal to stop on field oxide to form the semiconductor device 100 as shown in FIG. 1.

Figure 2:
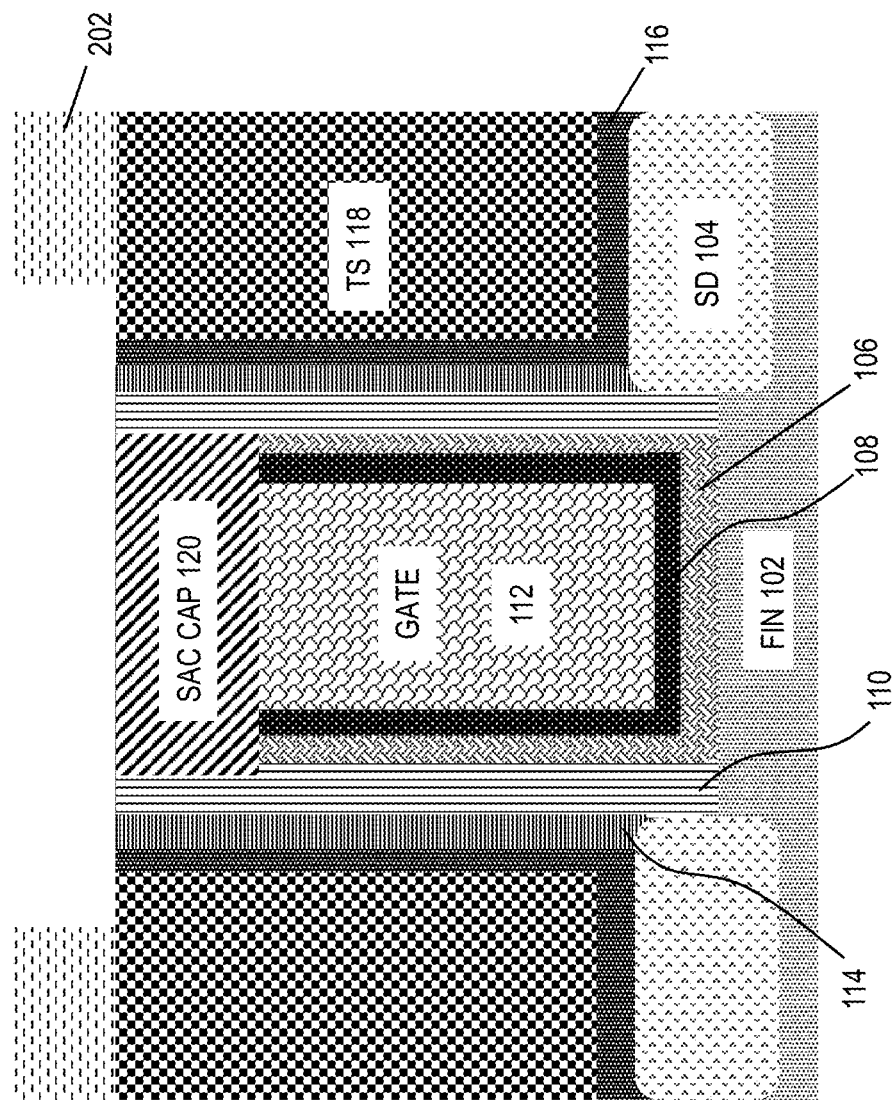
FIG. 2 depicts a cross-sectional view of the semiconductor device after fabrication operations according to embodiments of the invention.

FIG. 2 depicts a cross-sectional view of the semiconductor device 100 after fabrication processes according to embodiments of the invention. A hard mask 202 is deposited on top of the semiconductor device 100. The hard mask 202 can be, for example, silicon nitride, titanium nitride, silicon dioxide, silicon oxynitride, etc. The hard mask 202 is etched, for example, using reactive ion etching (RIE), to form an opening in the hard mask 202 exposing a top surface of the SAC cap 120, gate spacer material 110, liner 114, and first metal liner 116, along with a portion of the TS 118. The opening in the hard mask 202 is the XC opening or local connection opening.

Figure 3:
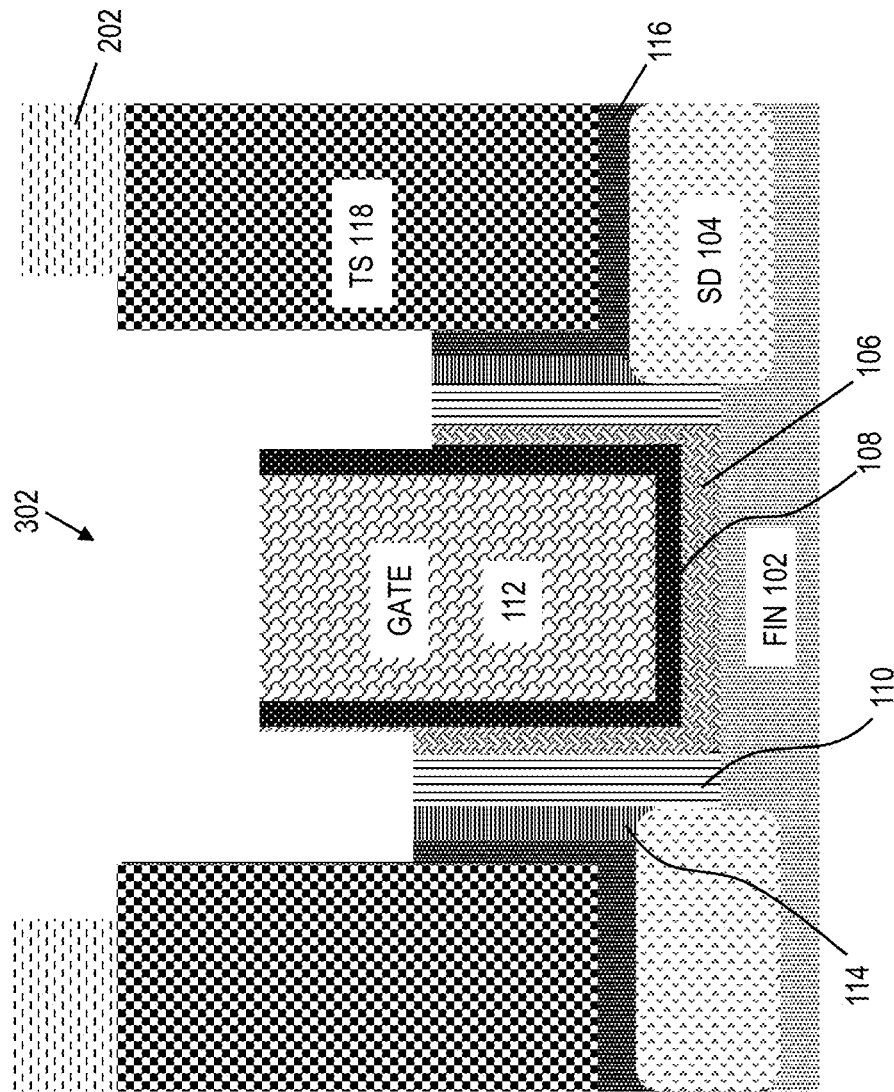
FIG. 3 depicts a cross-sectional view of the semiconductor device after fabrication operations according to embodiments of the invention.

FIG. 3 depicts a cross-sectional view of the semiconductor device 100 after fabrication processes according to embodiments of the invention. Using the pattern of the hard mask 302, a etch, for example, reactive ion etching (RIE), is performed to recess the gate spacer material 110, liner 114, first metal liner 116, and high-k dielectric material 106, along with removing the SAC cap 120.

Figure 4:
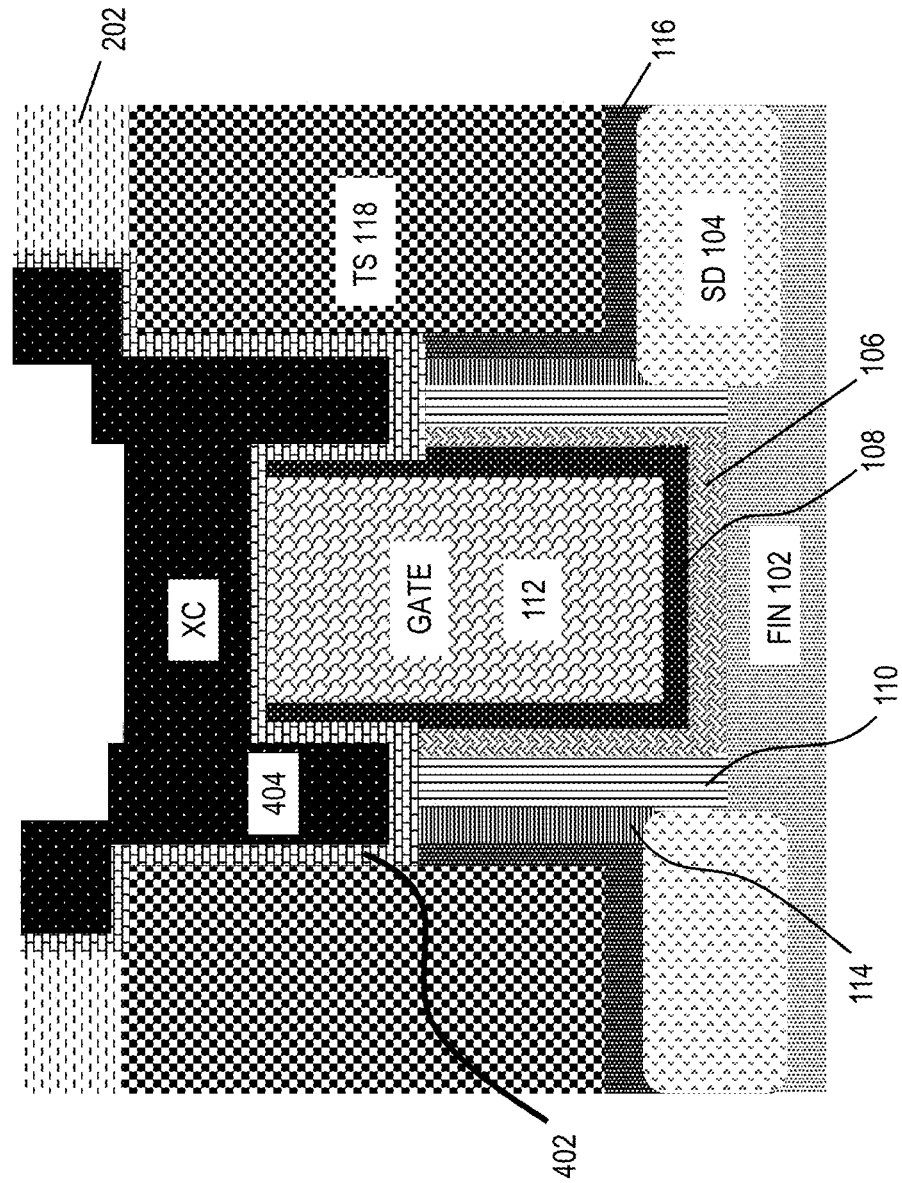
FIG. 4 depicts a cross-sectional view of the semiconductor device after fabrication operations according to embodiments of the invention.

FIG. 4 depicts a cross-sectional view of the semiconductor device 100 after fabrication processes according to embodiments of the invention. A second metal liner 402 is deposited in the opening 302 (depicted in FIG. 2). Example materials of the second metal liner 402 can include titanium nitride (TiN), tantalum nitride (TaN), hafnium nitride (HfN), niobium nitride (NbN), tungsten nitride (WN), or combinations thereof. Metal is deposited on the second metal liner 402 to form the local connection 404 which is also referred to as the XC connection. The opening 302 is now filled with metal of the local connection 404. Example metals of the local connection can include tungsten, copper, cobalt. In some implementations, the second metal liner 402 is not utilized. The purpose of the metal liner 402 is to prevent the metal ions from diffusing into mask 202.

Figure 5:
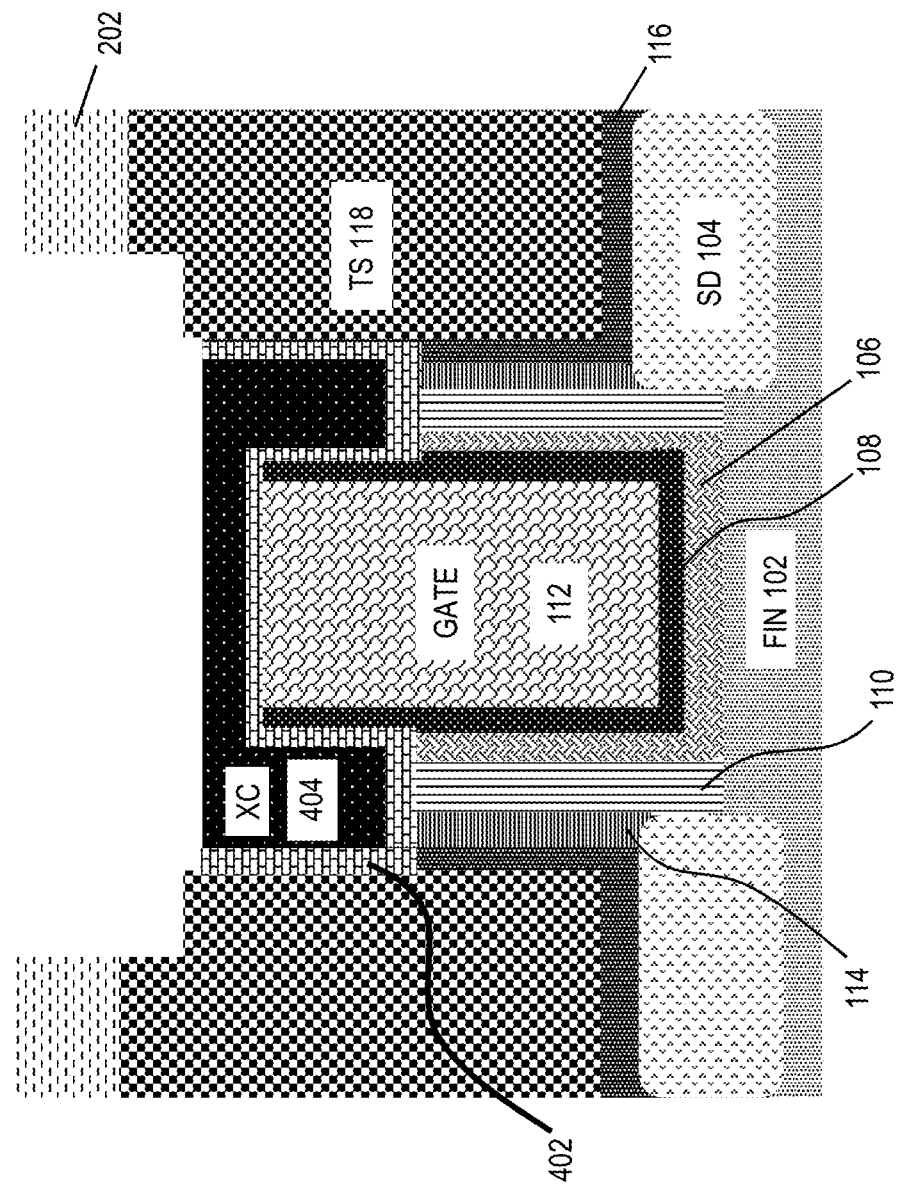
FIG. 5 depicts a cross-sectional view of the semiconductor device after fabrication operations according to embodiments of the invention.

FIG. 5 depicts a cross-sectional view of the semiconductor device 100 after fabrication processes according to embodiments of the invention. The metal of the local connection 404 is etched back.

Figure 6:
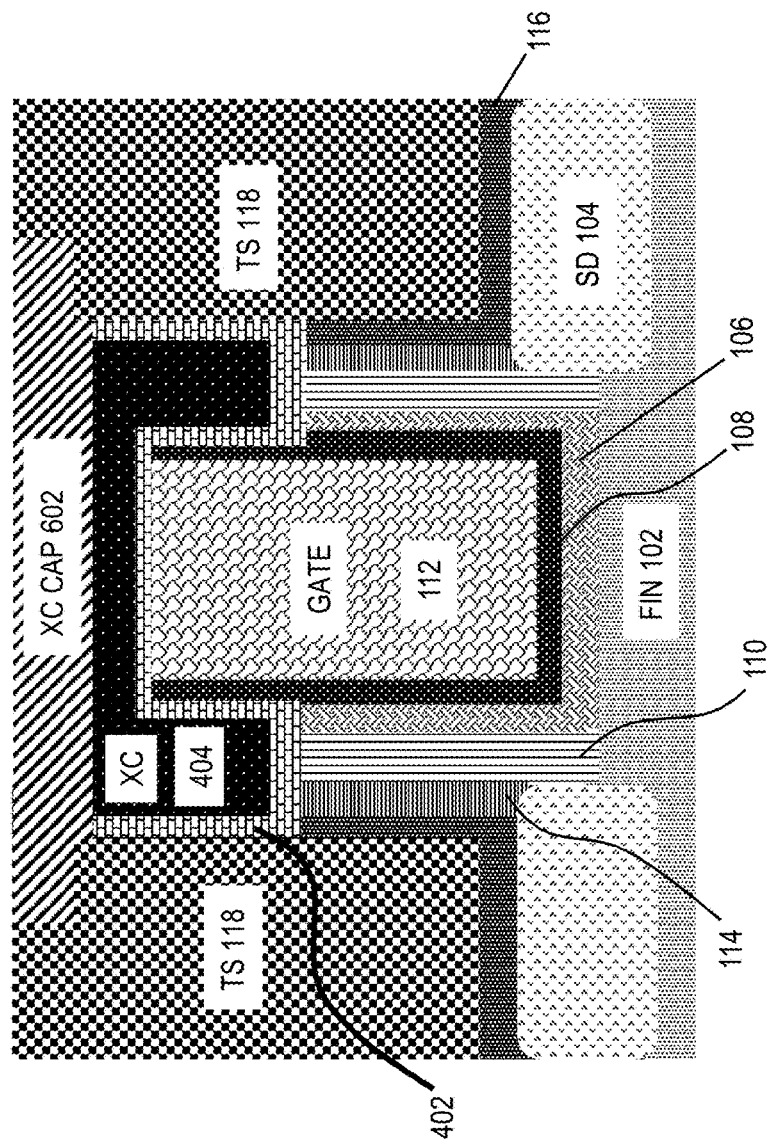
FIG. 6 depicts a cross-sectional view of the semiconductor device after fabrication operations according to embodiments of the invention.

FIG. 6 depicts a cross-sectional view of the semiconductor device 100 after fabrication processes according to embodiments of the invention. The hard mask 202 is removed and the opening is filed with cap material of the local connection cap 602. Local connection cap 602 and XC cap can be utilized interchangeably. Chemical mechanical polishing/planarization (CMP) is performed. The local connection cap 602 can be SiOCN, SiOC, SiC, SIBCN, SiCN, BN, SiON, and combinations thereof. In FIG. 6, the XC connection 404 electrically connects the left TS 118, the gate (gate metal 112, work function metal 108, and high-k dielectric material 106), and the right TS 118. The XC connection 404 is a very low power and low current connection that does not cause shorting problems. The XC cap 602 protects the XC connection 404 from contacts (above) such as from shorting to S/D contacts.

Figure 7:
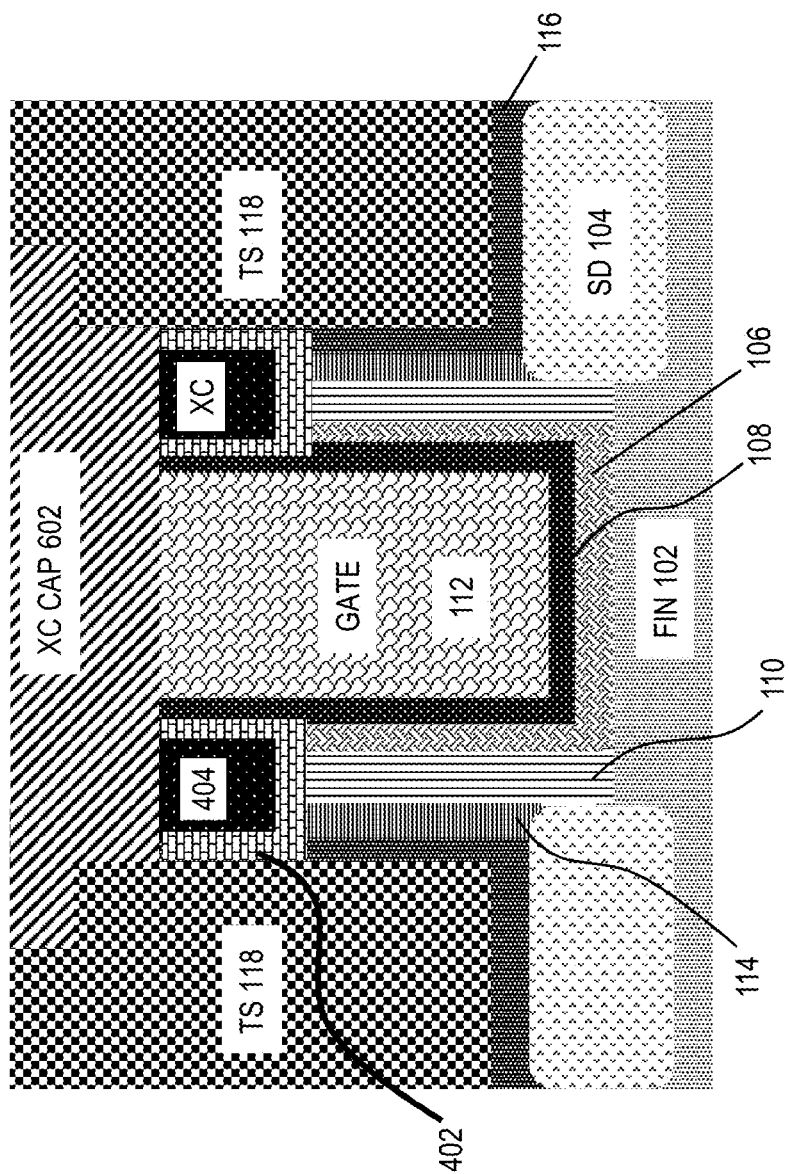
FIG. 7 depicts a cross-sectional view of the semiconductor device after fabrication operations according to embodiments of the invention.

There can be various modifications to the semiconductor device 100 in FIG. 6. FIG. 7 depicts a cross-sectional view of the semiconductor device 100 which is a modification to FIG. 6 according to embodiments of the invention. In FIG. 7, a deeper XC metal recess is performed than in FIG. 5, such that the XC connection 404 no longer extends across the top of the gate metal 112 and work function metal 108. Rather, the semiconductor device 100 in FIG. 7 shows a left XC connection 404 on the left side of the gate metal 112 and work function metal 108 and a right XC connection on the right side. The two XC connections 404 electrically connect the left TS 118, the gate (gate metal 112, work function metal 108, and high-k dielectric material 106), and the right TS 118. Further, the XC cap 602 is now formed directly on top of the gate metal 112 and work function metal 108.

Figure 8:
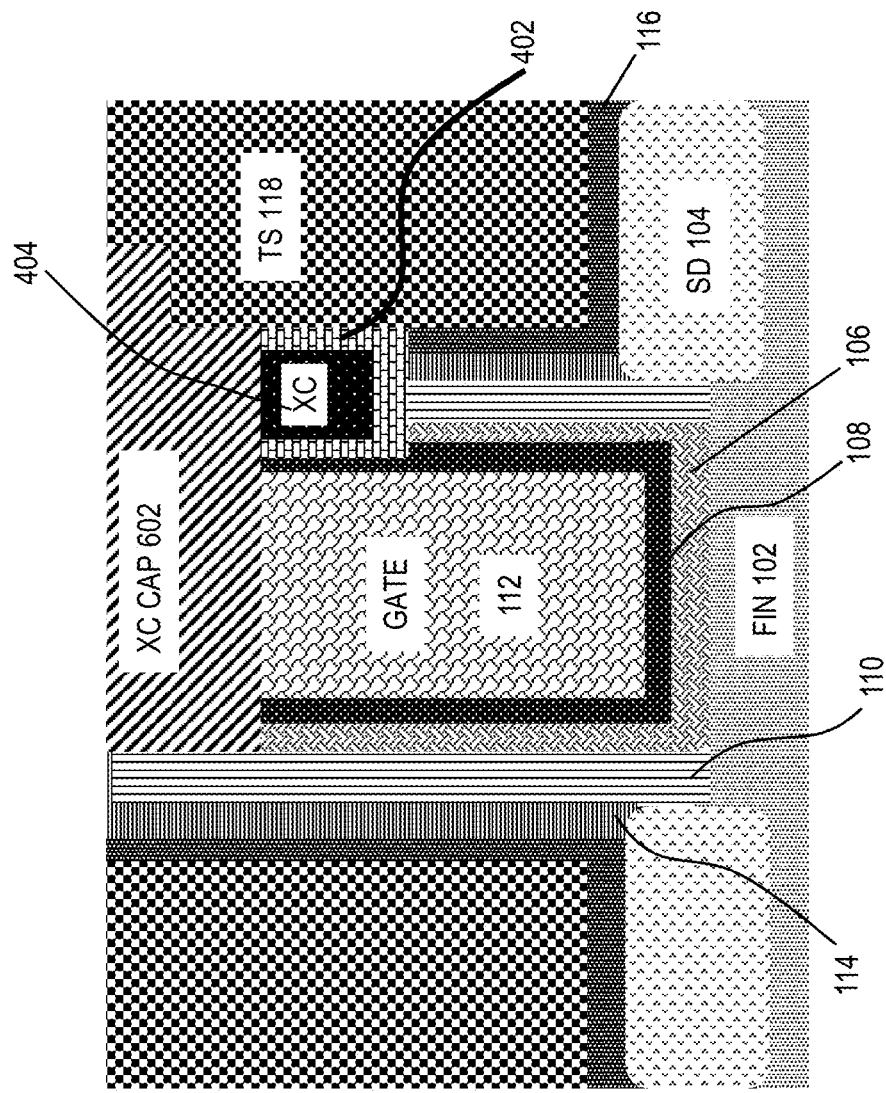
FIG. 8 depicts a cross-sectional view of the semiconductor device after fabrication operations according to embodiments of the invention.

FIG. 8 depicts a cross-sectional view of the semiconductor device 100 which is a modification to FIG. 6 according to embodiments of the invention. FIG. 7 uses one of the two XC connections 404 shown in FIG. 7. FIG. 8 depicts the XC connection 404 on the right side of the gate (gate metal 112, work function metal 108, and high-k dielectric material 106). In this case, the right XC connection 404 connects the gate metal 112 via work function metal 108 to the TS 118. In some implementations, the XC local connection 404 could be on the left side and not the right side.

FIG. 9A depicts a simple diagram of a top view of a semiconductor device 900 after an initial set of fabrication operations according to embodiments of the invention. For simplicity and ease of understanding, FIG. 9A omits layers (elements) so as to expose underlying layers. Also, FIG. 9A illustrates transparent layers (elements). In FIG. 9A, the dashed lines are representative of future locations of the local (XC) connection location, the S/D (CA) metal contact location, and the gate (CB) metal contact location. It is noted that FIGS. 1-8 can generally be representative of cross-sectional views of the semiconductor device 100 along X-X in FIG. 9A, although the XC, CB and CA locations can be different.

Figure 9D:
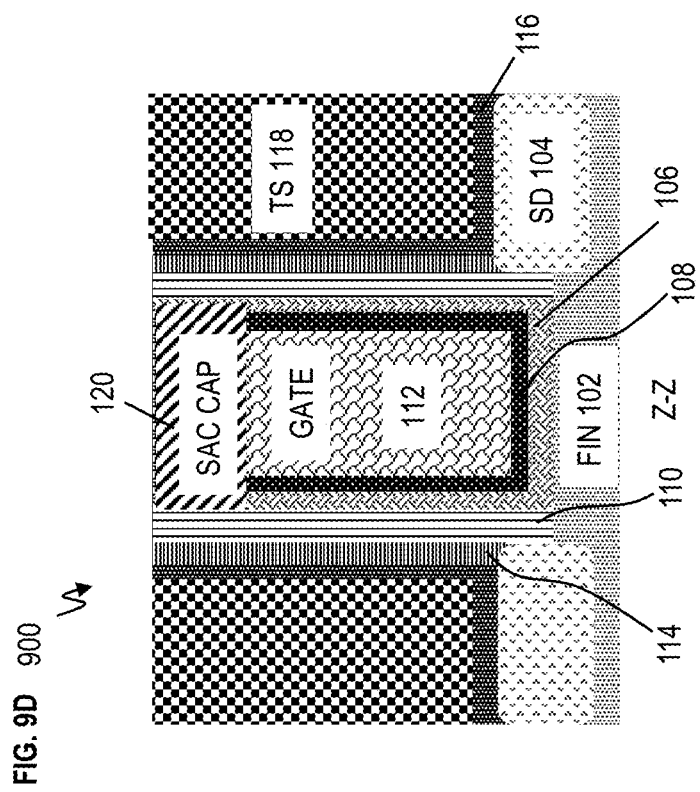
FIG. 9D depicts a cross-sectional view of the semiconductor device taken along line Z-Z in FIG. 9A according to embodiments of the invention.

FIG. 9B depicts a cross-sectional view of the semiconductor device 900 shown in FIG. 9A taken along line X-X. FIG. 9C depicts a cross-sectional view of the semiconductor device 900 shown in FIG. 9A taken along line Y-Y. FIG. 9D depicts a cross-sectional view of the semiconductor device 900 shown in FIG. 9A taken along line Z-Z. The semiconductor device 900 can include some of the same elements as semiconductor device 100. Similarly, after initial fabrication processing, the semiconductor device 900 includes fins 102 with source/drain (SD) regions 104 formed on both sides of the fins 102. FIG. 9A shows three fins in in parallel (e.g., extending left-to-right or vice versa), with the S/D region on each end.

The gate structure includes one or more high-k dielectric materials 106, one or more work function metals 108 formed on the high-k dielectric material 106, and the gate metal 112 formed on the work function metal 108. The gate spacer material 110 is formed on the sides of the high-k dielectric material 106. The polymer liner 114 is formed on the sides of the gate spacer material 110 and on the S/D regions 104. The first metal liner 116 is formed on the polymer liner 114 and the S/D 104. The silicide or trench silicide (TS) 118 is formed on the first metal liner 116 to be over the S/D regions 104. Although not shown in FIG. 1A, the TS is on top of the two S/D regions which are on top three fins. The gate (or SAC) cap 120 is formed on top of the high-k dielectric material 106, the work function metal 108, and the gate metal 112 (which form the gate structure).

Figure 10C:
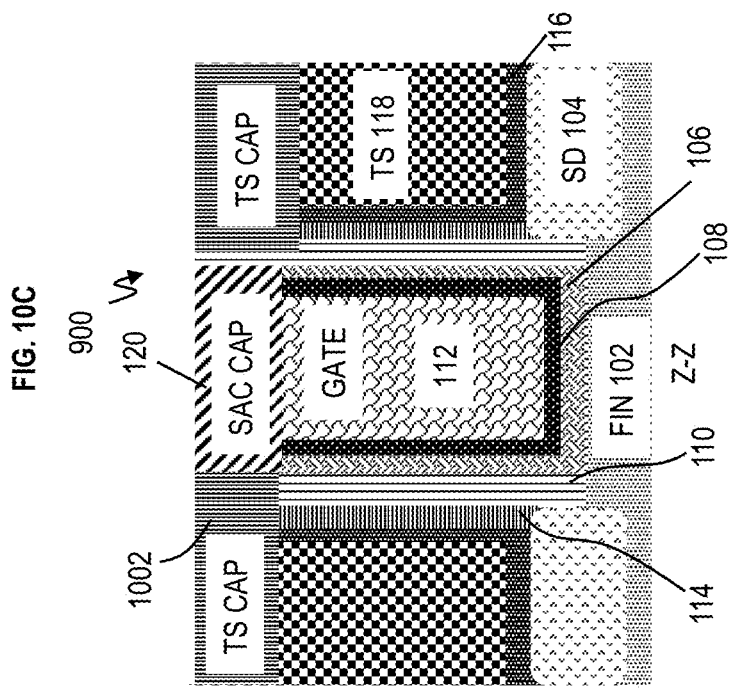
FIG. 10C depicts a cross-sectional view of the semiconductor device taken along line Z-Z in FIG. 9A according to embodiments of the invention

FIG. 10A depicts a cross-sectional view of the semiconductor device 900 taken along line X-X in FIG. 9A after fabrication operations according to embodiments of the invention. FIG. 10B depicts a cross-sectional view of the semiconductor device 900 shown in FIG. 9A taken along line Y-Y after fabrication operations according to embodiments of the invention. FIG. 10C depicts a cross-sectional view of the semiconductor device 900 shown in FIG. 9A taken along line Y-Y according to embodiments of the invention.

Etching is performed to recess the TS 118, polymer liner 114, first metal liner 116, along with a portion of gate spacer material 110, thereby leaving trenches (no shown) over the TS 111. Subsequently, these trenches are filled with the material of the TS caps 1002 in FIGS. 10A, 10B, 10C, and chemical mechanical polishing/planarization (CMP) is performed to stop on the SAC cap 120. Example materials of the TS caps 120 can include SiOCN, SiOC, SiC, SIBCN, SiCN, BN, SiON, and combinations thereof. In some implementations, the SAC cap 120 is silicon nitride while the TS caps 120 are silicon oxycarbide. Although not shown in FIG. 9A, the TS caps 120 would be on top of the TS formed on the S/D regions, such that the (left and right) TS caps 120 extend across all three fins.

Figure 11C:
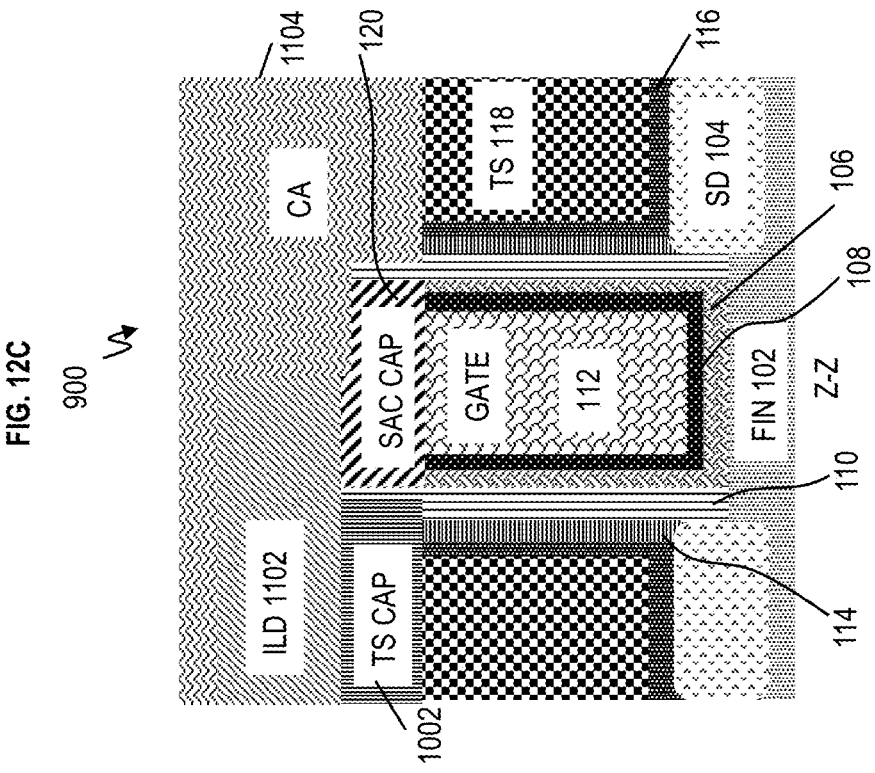
FIG. 11C depicts a cross-sectional view of the semiconductor device taken along line Z-Z in FIG. 9A according to embodiments of the invention

FIG. 11A depicts a cross-sectional view of the semiconductor device 900 taken along line X-X in FIG. 9A after fabrication operations according to embodiments of the invention. FIG. 11B depicts a cross-sectional view of the semiconductor device 900 shown in FIG. 9A taken along line Y-Y after fabrication operations according to embodiments of the invention. FIG. 11C depicts a cross-sectional view of the semiconductor device 900 shown in FIG. 9A taken along line Z-Z according to embodiments of the invention.

An inter-level dielectric (ILD) material 1102 is formed on top of the semiconductor device 900. The ILD material 1102 is a low-k dielectric material, such as, for example, a low-k oxide material (e.g., silicon dioxide). A block mask 1104 is formed on top of the ILD material 1102 as shown in FIGS. 11A, 11B, and 11C. The block mask 1104 can be, for example, organic planarization layer (OPL). To open up the future CA location, FIG. 11C shows CA location opening 1106. Etching is performed to remove a portion of ILD 1102, remove a portion of the block mask 1104, and remove the (right) TS cap 1002 in FIG. 11C. The TS cap 1002 can be removed by selective RIE etching, thus leaving an opening 1106. Removing the (right) TS cap 1002 exposes the TS 118 in FIG. 11C. The (left and right) TS caps 1002 still cover the TS 118 in FIGS. 11A and 11B.

Figure 12C:
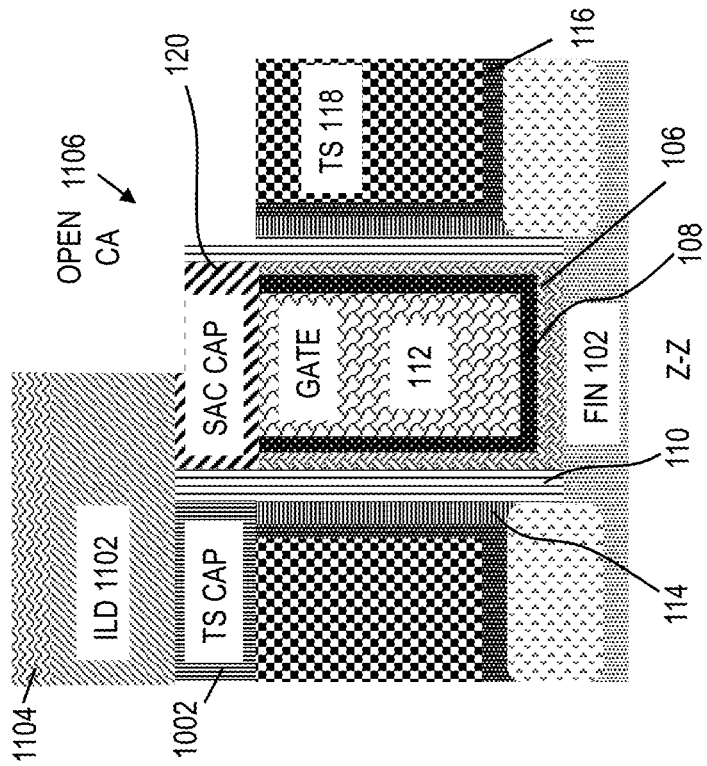
FIG. 12C depicts a cross-sectional view of the semiconductor device taken along line Z-Z in FIG. 9A according to embodiments of the invention

FIG. 12A depicts a cross-sectional view of the semiconductor device 900 taken along line X-X in FIG. 9A after fabrication operations according to embodiments of the invention. FIG. 12B depicts a cross-sectional view of the semiconductor device 900 shown in FIG. 9A taken along line Y-Y after fabrication operations according to embodiments of the invention. FIG. 12C depicts a cross-sectional view of the semiconductor device 900 shown in FIG. 9A taken along line Y-Y according to embodiments of the invention.

To open up the future CB location, FIG. 12B shows CB location opening 1202. Etching is performed to remove a portion of ILD 1102, remove a portion of the block mask 1104, and remove the SAC 120 for FIG. 12B. The SAC cap 120 can be removed by selective RIE etching, thus leaving opening 1202. The selective RIE etching exposes the gate metal 112 below. FIG. 12C shows that the future CA location opening 1106 (shown in FIG. 11C) has been filled back in with the block mask 1104, prior to opening the CB location opening 1202.

Figure 13B:
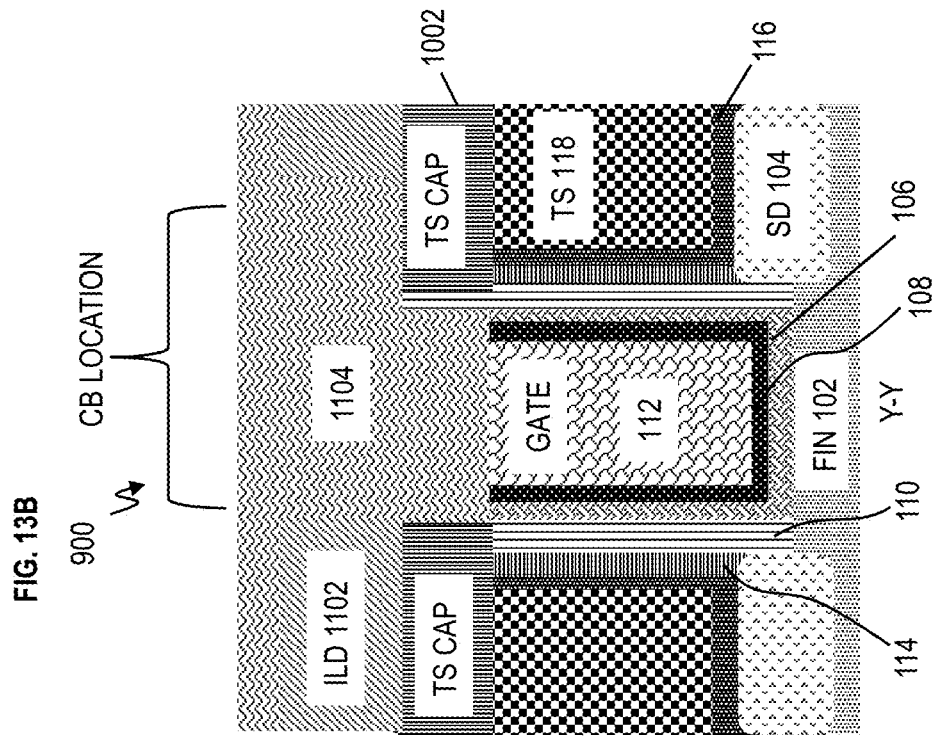
FIG. 13B depicts a cross-sectional view of the semiconductor device taken along line Y-Y in FIG. 9A after fabrication operations according to embodiments of the invention.
Figure 13A:
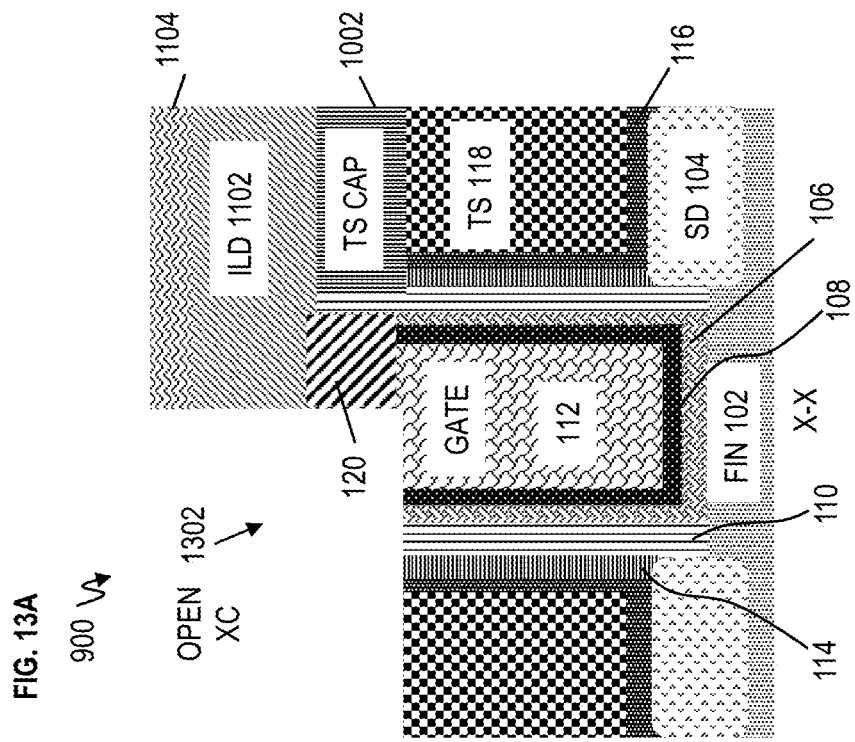
FIG. 13A depicts a cross-sectional view of the semiconductor device taken along line X-X in FIG. 9A after fabrication operations according to embodiments of the invention.
Figure 13C:
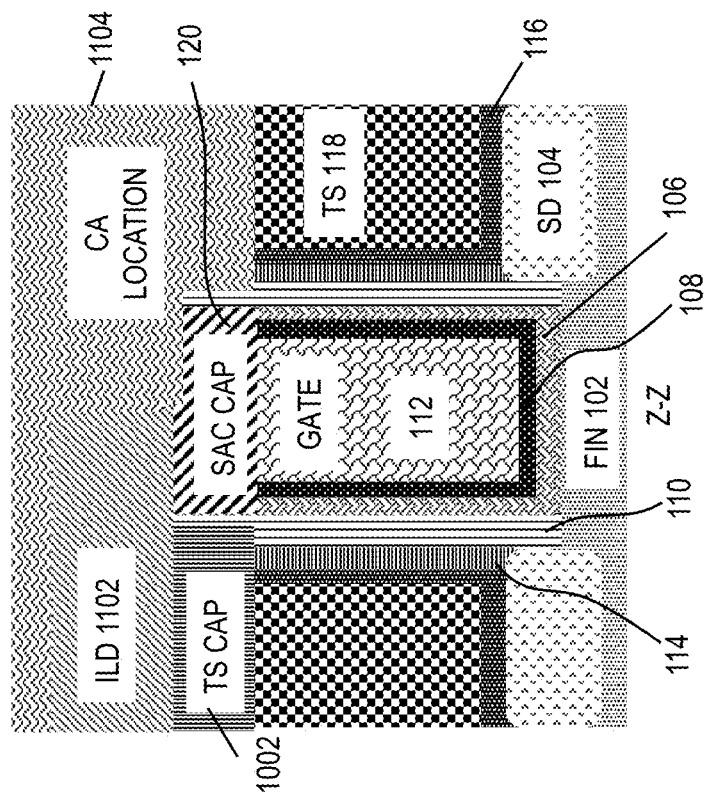
FIG. 13C depicts a cross-sectional view of the semiconductor device taken along line Z-Z in FIG. 9A according to embodiments of the invention.

FIG. 13A depicts a cross-sectional view of the semiconductor device 900 taken along line X-X in FIG. 9A after fabrication operations according to embodiments of the invention. FIG. 13B depicts a cross-sectional view of the semiconductor device 900 shown in FIG. 9A taken along line Y-Y after fabrication operations according to embodiments of the invention. FIG. 13C depicts a cross-sectional view of the semiconductor device 900 shown in FIG. 9A taken along line Y-Y according to embodiments of the invention.

FIG. 13B shows that the future CA location opening 1201 in FIG. 12B has been filled back in with the block mask 1104. FIG. 13A now shows that an XC opening 1302. To form the XC opening 1302, an (e.g., RIE) is performed to stop on both the SAC cap 120 and TS cap 1001. Then, a selective etch is performed to remove the TS cap 1002 and a selective etch is performed to remove part of the SAC cap 120. The XC opening 1302 exposes both the (left) TS 118 and gate metal 112.

Figure 14A:
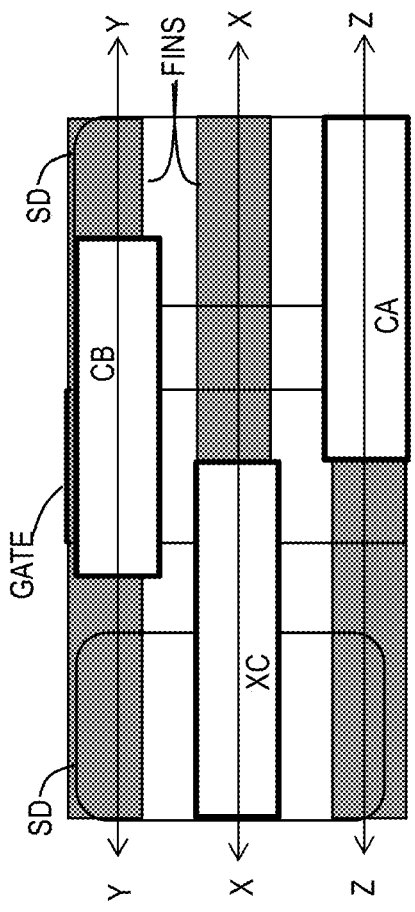
FIG. 14A depicts a simple diagram of a top view of the semiconductor device after fabrication operations according to embodiments of the invention.
Figure 14B:
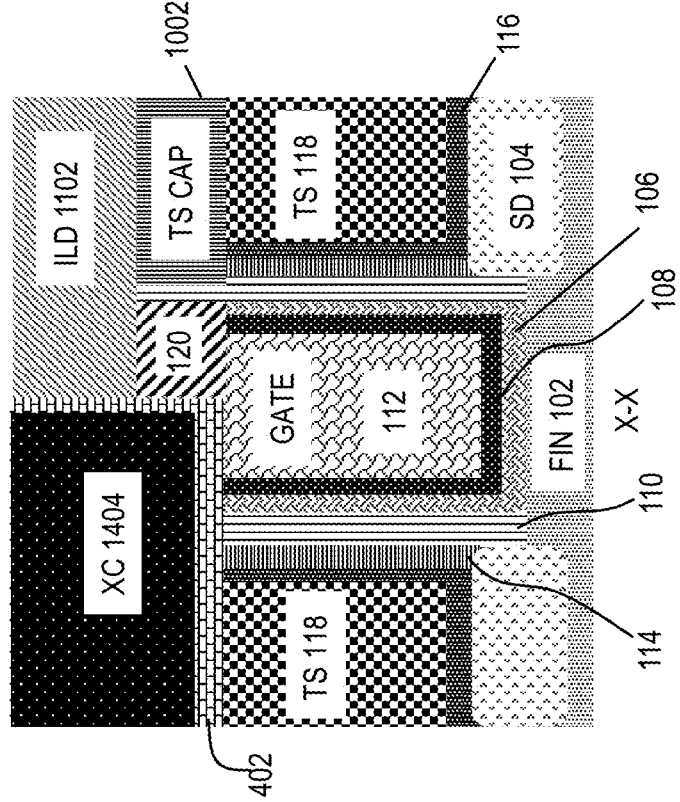
FIG. 14B depicts a cross-sectional view of the semiconductor device taken along line X-X in FIG. 14A according to embodiments of the invention.

FIG. 14A depicts a simple diagram of a top view of the semiconductor device 900 after fabrication operations according to embodiments of the invention. For simplicity and ease of understanding, FIG. 14A omits layers (elements) so as to expose underlying layers. Also, FIG. 14A illustrates transparent layers (elements). In FIG. 14A, the locations of the local (XC) connection location, the S/D (CA) metal contact location, and the gate (CB) metal contact location have been formed and are no longer dashed. FIG. 14B depicts a cross-sectional view of the semiconductor device 900 taken along line X-X in FIG. 14A according to embodiments of the invention. FIG. 14C depicts a cross-sectional view of the semiconductor device 900 shown in FIG. 14A taken along line Y-Y according to embodiments of the invention. FIG. 14D depicts a cross-sectional view of the semiconductor device 900 shown in FIG. 14A taken along line Y-Y according to embodiments of the invention.

All block masks 1104 are stripped, which reopens the previous CA location opening 1106 in FIG. 11C and the previous CB location opening 1202 in FIG. 12B, while the XC location opening 1302 is open. The metal liner 402 is deposited in the XC opening 1302, reopened CA location opening 1106, and the reopened CB location 1202. Metal is deposited on the metal liner 402 in FIGS. 14A, 14B, 14C, 14D to form the local connection 1404 (which is also referred to as the XC connection) as best seen in FIG. 14B, to form the CB metal contact 1406 (which is also referred to as the gate metal contact) as best seen in FIG. 14C, and to form the CA metal contact 1408 (which is also referred to as S/D metal contact). Example metals of the XC local connection 1404, CB metal contact 1406, and CA metal contact 1408 can include tungsten, aluminum, copper, etc.

Figure 15A:
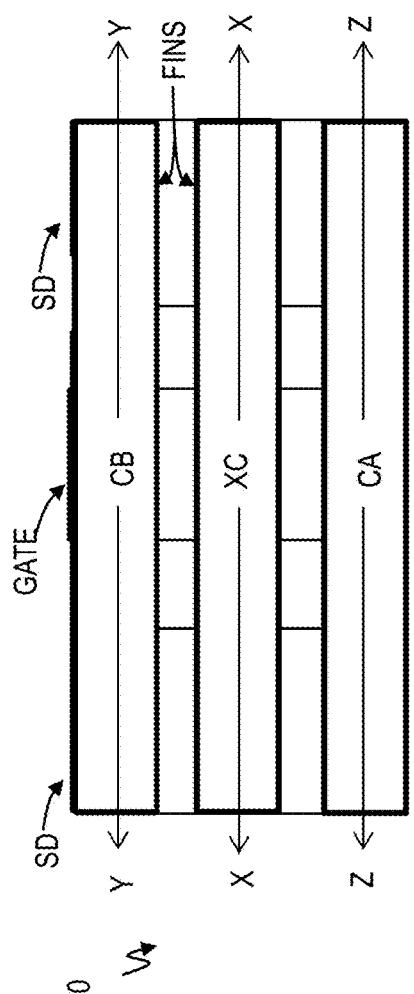
FIG. 15A depicts a simple diagram of a top view of the semiconductor device after fabrication operations according to embodiments of the invention.
Figure 15B:
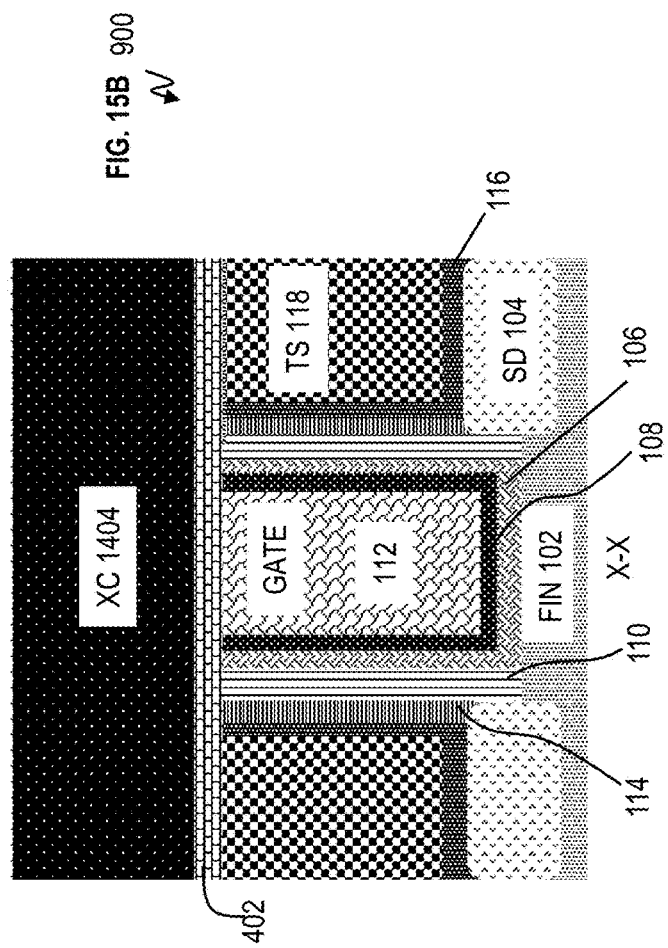
FIG. 15B depicts a cross-sectional view of the semiconductor device taken along line X-X in FIG. 15A according to embodiments of the invention.

FIG. 15A depicts a simple diagram of a top view of the semiconductor device 900 after fabrication operations according to embodiments of the invention. For simplicity and ease of understanding, FIG. 15A omits some layers (elements) so as to expose underlying layers. Also, FIG. 15A illustrates transparent layers (elements). In FIG. 15A, the locations of the local (XC) connection location, the S/D (CA) metal contact location, and the gate (CB) metal contact location have been formed. FIG. 15B depicts a cross-sectional view of the semiconductor device 900 taken along line X-X in FIG. 15A according to embodiments of the invention. FIG. 15C depicts a cross-sectional view of the semiconductor device 900 shown in FIG. 15A taken along line Y-Y according to embodiments of the invention. FIG. 15D depicts a cross-sectional view of the semiconductor device 900 shown in FIG. 15A taken along line Z-Z according to embodiments of the invention. FIGS. 15A, 15B, 15C, and 15D illustrate modifications in which the XC local connection 1404, CB metal contact 1406, and CA metal contact 1408 cover a greater length than in FIGS. 14A, 14B, 14C, and 14D. The XC local connection 1404, CB metal contact 1406, and CA metal contact 1408 cover the entire length (from left-to-right or vice versa) of their respective fins 102.

Figure 16A:
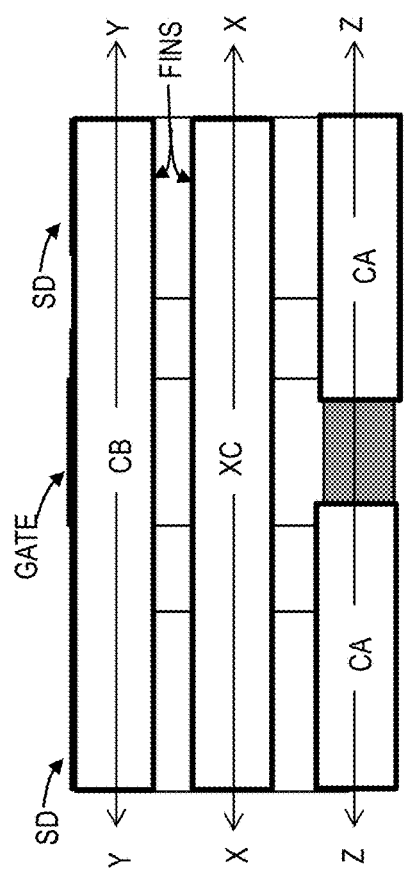
FIG. 16A depicts a simple diagram of a top view of the semiconductor device after fabrication operations according to embodiments of the invention.
Figure 16B:
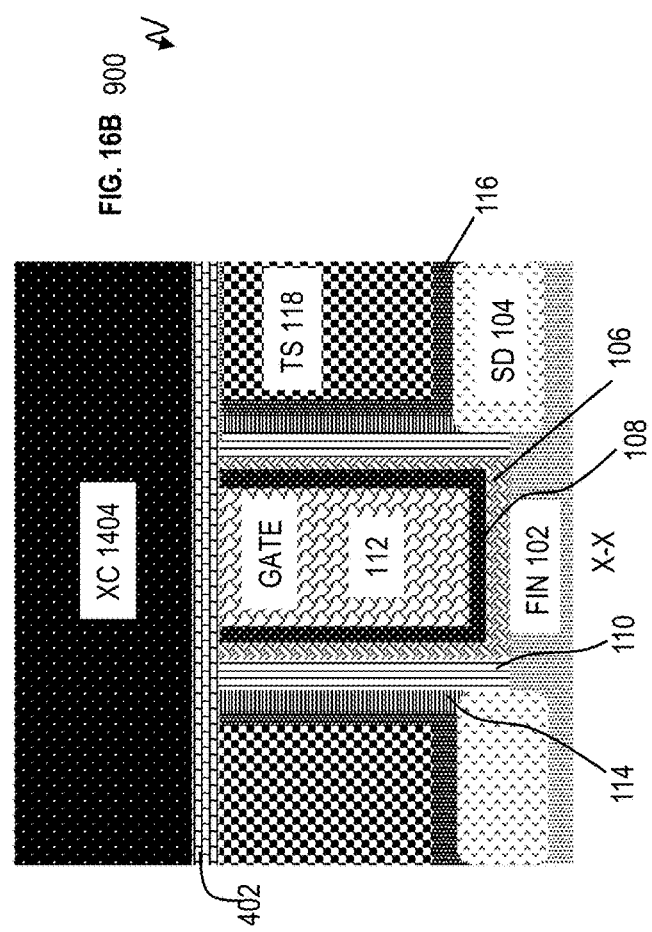
FIG. 16B depicts a cross-sectional view of the semiconductor device taken along line X-X in FIG. 16A according to embodiments of the invention.
Figure 16D:
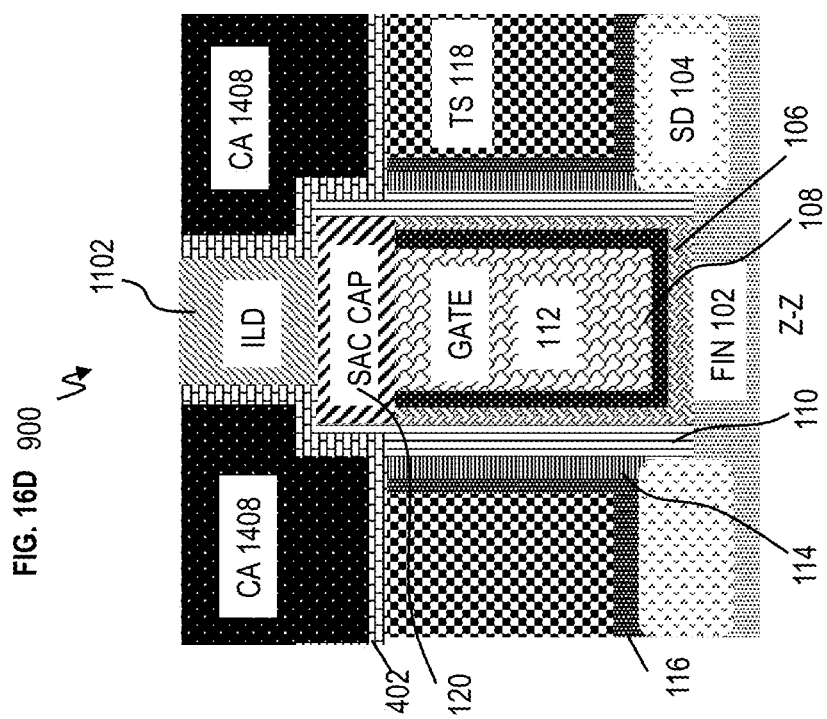
FIG. 16D depicts a cross-sectional view of the semiconductor device taken along line Z-Z in FIG. 16A according to embodiments of the invention.
Figure 16C:
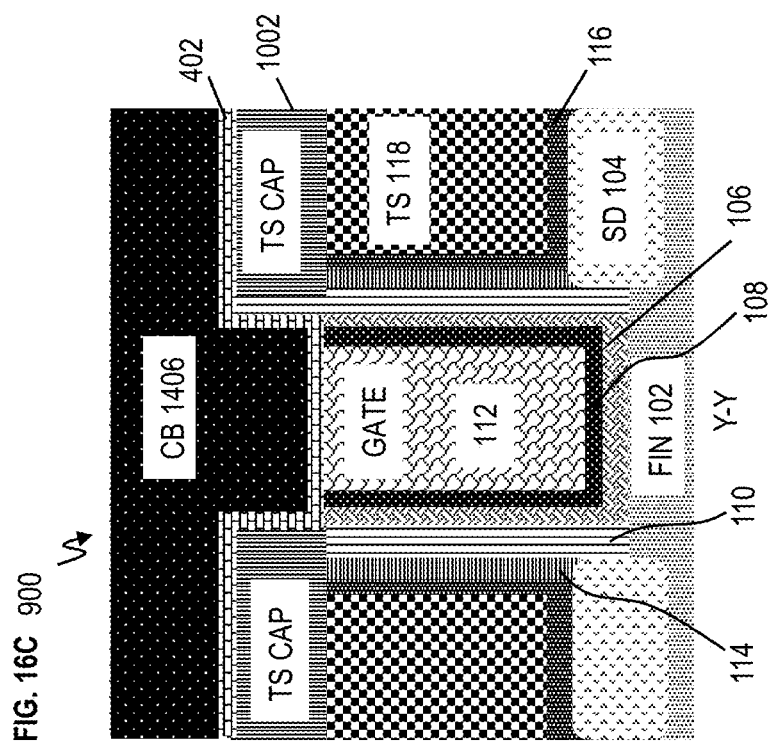
FIG. 16C depicts a cross-sectional view of the semiconductor device taken along line Y-Y in FIG. 16A according to embodiments of the invention.

FIG. 16A depicts a simple diagram of a top view of the semiconductor device 900 according to embodiments of the invention. In FIG. 16A, the locations of the local (XC) connection location, the S/D (CA) metal contact location, and the gate (CB) metal contact location have been formed. FIG. 16B depicts a cross-sectional view of the semiconductor device 900 taken along line X-X in FIG. 16A according to embodiments of the invention. FIG. 16C depicts a cross-sectional view of the semiconductor device 900 shown in FIG. 16A taken along line Y-Y according to embodiments of the invention. FIG. 16D depicts a cross-sectional view of the semiconductor device 900 shown in FIG. 16A taken along line Z-Z according to embodiments of the invention. FIGS. 16A, 16B, 16C, and 16D illustrate modifications in which the XC local connection 1404, CB metal contact 1406, and CA metal contact 1408 cover a greater length than in FIGS. 14A, 14B, 14C, and 14D, which is similar to FIGS. 15A, 15B, 15C, and 15D. The XC local connection 1404 and CB metal contact 1406 cover the entire length (from left-to-right or vice versa) of the respective fins 102. Additionally, there are two CA metal contacts 1408 because the CA metal contact has been split in FIG. 16D.

Figure 17C:
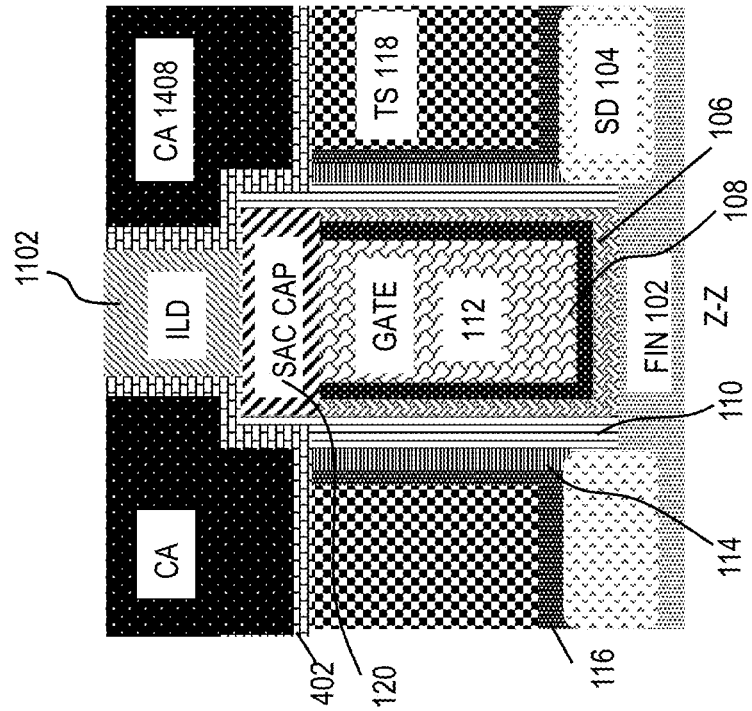
FIG. 17C depicts a cross-sectional view of the semiconductor device taken along line Y-Y in FIG. 17A according to embodiments of the invention.
Figure 17D:
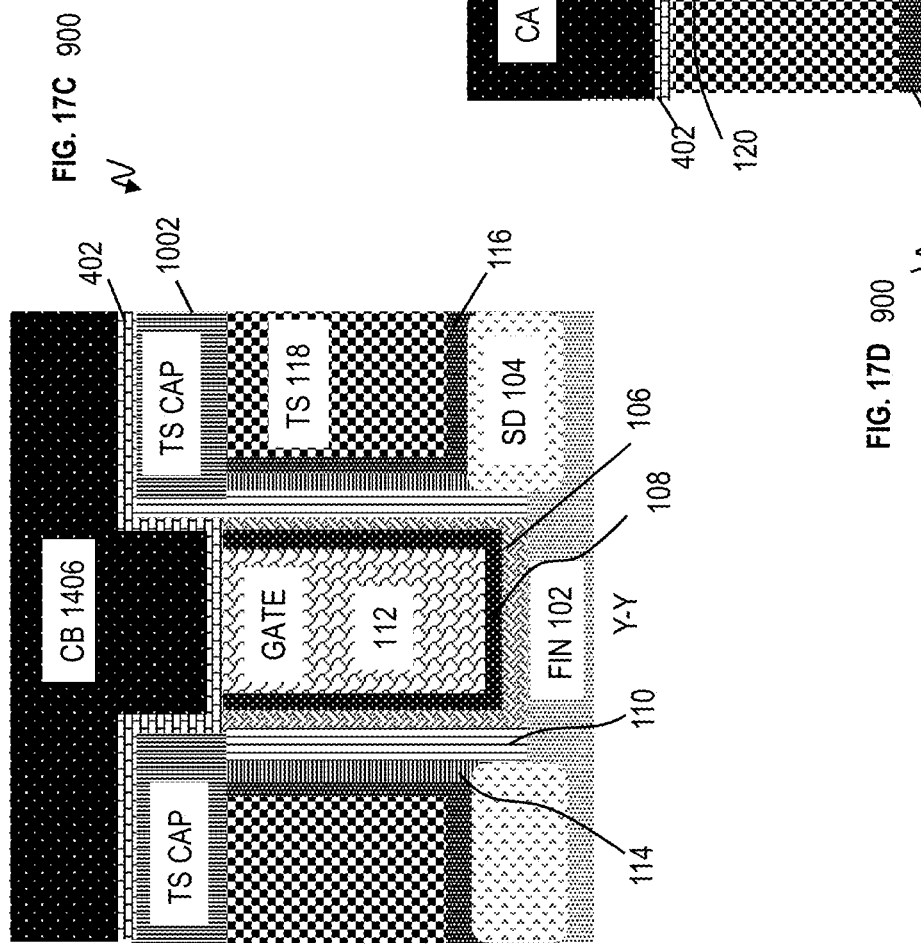
FIG. 17D depicts a cross-sectional view of the semiconductor device taken along line Z-Z in FIG. 17A according to embodiments of the invention.

FIG. 17A depicts a simple diagram of a top view of the semiconductor device 900 according to embodiments of the invention. In FIG. 17A, the locations of the local (XC) connection location, the S/D (CA) metal contact location, and the gate (CB) metal contact location have been formed. FIG. 17B depicts a cross-sectional view of the semiconductor device 900 taken along line X-X in FIG. 17A according to embodiments of the invention. FIG. 17C depicts a cross-sectional view of the semiconductor device 900 shown in FIG. 17A taken along line Y-Y according to embodiments of the invention. FIG. 17D depicts a cross-sectional view of the semiconductor device 900 shown in FIG. 17A taken along line Z-Z according to embodiments of the invention. FIGS. 17A, 17B, 17C, and 17D illustrate modifications in which the XC local connection 1404, CB metal contact 1406, and CA metal contact 1408 cover a greater length than in FIGS. 14A, 14B, 14C, and 14D. The CB metal contact 1406 covers the entire length of the corresponding fin 102 in FIG. 17C. However, there are two XC local connections 1404 over the fin 102 in FIG. 17B and two CA metal contacts 1408 over the fin 102 in FIG. 17D.

Figure 18A:
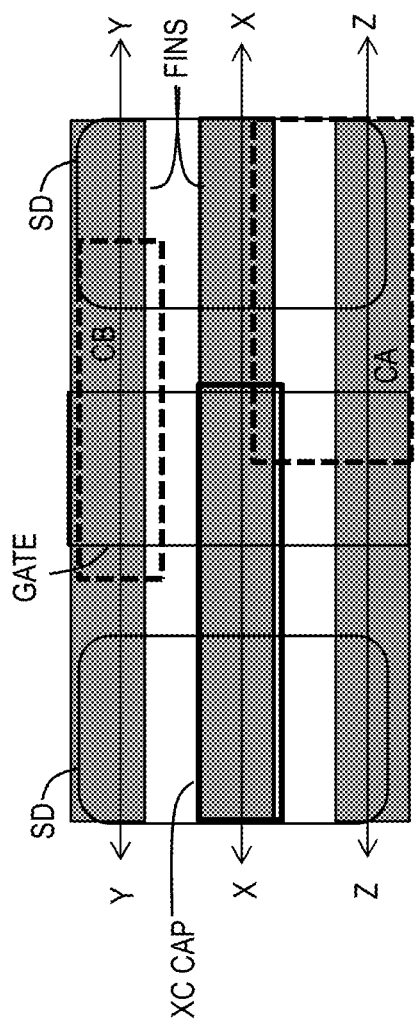
FIG. 18A depicts a simple diagram of a top view of the semiconductor device after fabrication operations according to embodiments of the invention.
Figure 18B:
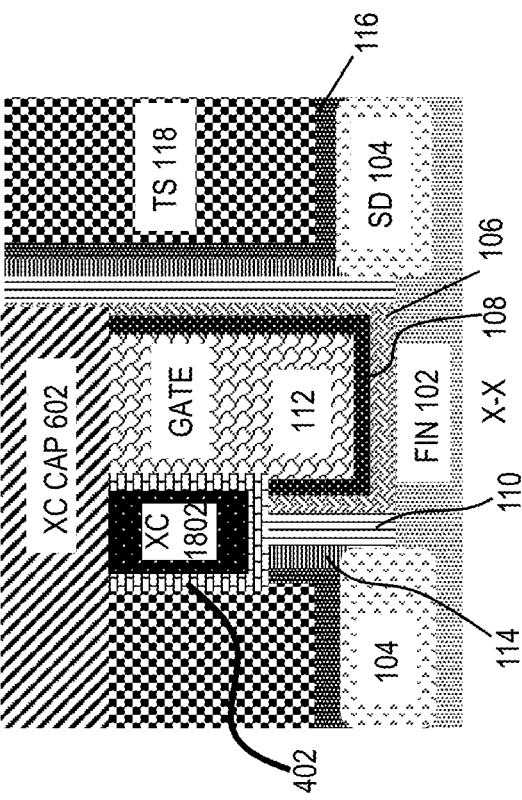
FIG. 18B depicts a cross-sectional view of the semiconductor device taken along line X-X in FIG. 18A according to embodiments of the invention.
Figure 18C:
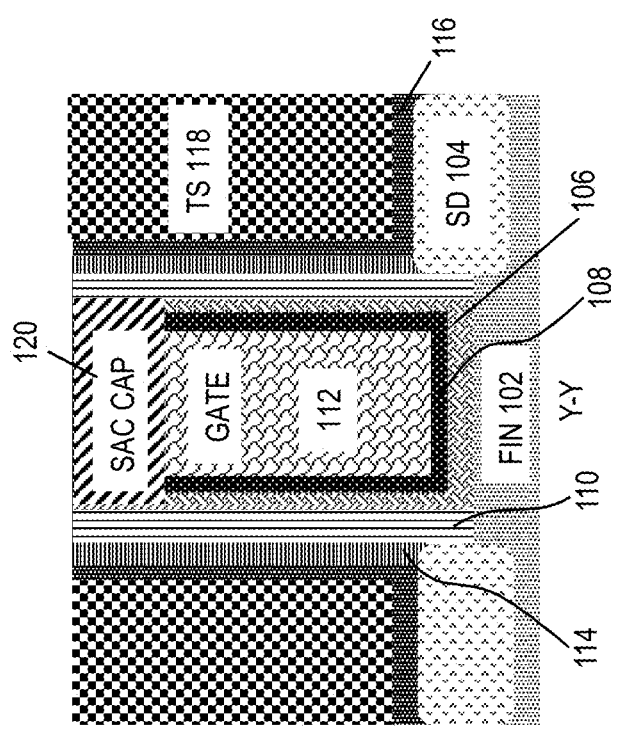
FIG. 18C depicts a cross-sectional view of the semiconductor device taken along line Y-Y in FIG. 18A according to embodiments of the invention.
Figure 18D:
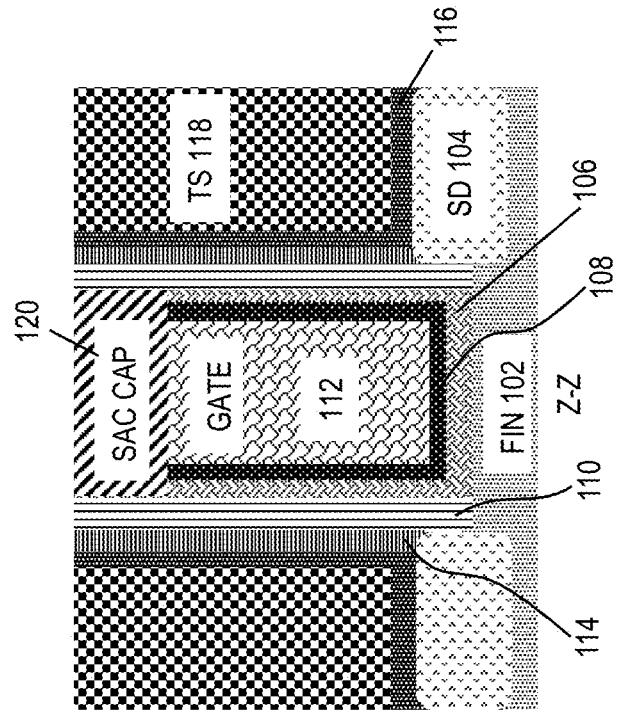
FIG. 18D depicts a cross-sectional view of the semiconductor device taken along line Z-Z in FIG. 18A according to embodiments of the invention.

FIG. 18A depicts a simple diagram of a top view of the semiconductor device 900 after initial fabrication operations according to embodiments of the invention. For simplicity and ease of understanding, FIG. 18A omits layers (elements) so as to expose underlying layers. Also, FIG. 18A illustrates transparent layers (elements). In FIG. 18A, the XC cap has been formed above the XC connection, while the S/D (CA) metal contact location and the gate (CB) metal contact location have not been formed so their respective locations are represented dashed. FIG. 18B depicts a cross-sectional view of the semiconductor device 1800 taken along line X-X in FIG. 18A according to embodiments of the invention. FIG. 18C depicts a cross-sectional view of the semiconductor device 1800 shown in FIG. 18A taken along line Y-Y according to embodiments of the invention. FIG. 18D depicts a cross-sectional view of the semiconductor device 1800 shown in FIG. 18A taken along line Z-Z according to embodiments of the invention. There is an XC local connection which electrically connects the left TS 118 to the gate metal 112 as depicted in FIG. 18B. The XC cap 602 extends from the left TS 118 across the gate metal 112 until reaching the gate spacer material 110 on the right, as depicted in FIG. 18B.

Figure 19C:
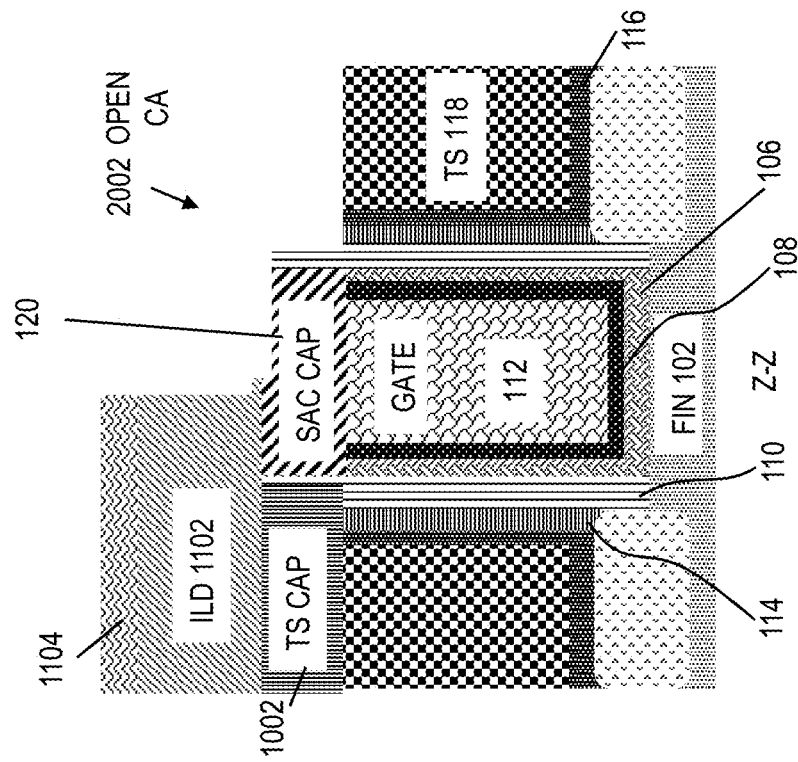
FIG. 19C depicts a cross-sectional view of the semiconductor device taken along line Z-Z in FIG. 18A after fabrication operations according to embodiments of the invention.

FIG. 19A depicts a cross-sectional view of the semiconductor device 1800 taken along line X-X in FIG. 18A after fabrication operations according to embodiments of the invention. FIG. 19B depicts a cross-sectional view of the semiconductor device 1800 shown in FIG. 18A taken along line Y-Y after fabrication operations according to embodiments of the invention. FIG. 19C depicts a cross-sectional view of the semiconductor device 1800 shown in FIG. 18A taken along line Y-Y according to embodiments of the invention.

Etching is performed to recess the TS 118, polymer liner 114, first metal liner 116, along with a portion of gate spacer material 110, thereby leaving trenches (no shown) over the TS 111 (analogous to FIGS. 10A, 10B, 10C). Subsequently, these trenches are filled with the material of the TS cap 1002 in FIGS. 19A, 19B, 19C, and chemical mechanical polishing/planarization (CMP) is performed to stop on the SAC cap 120 and XC cap 602. In FIG. 19A, the left TS 118 is not recessed because the XC cap 602 was previously formed as understood by one skilled in the art. Also, FIG. 19A has an XC local connection 1802 connecting the left TS 118 and the gate metal 112.

Figure 20C:
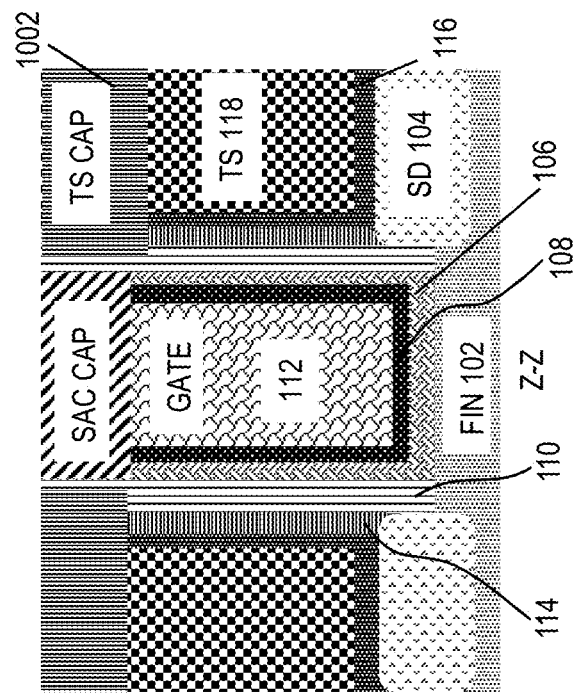
FIG. 20C depicts a cross-sectional view of the semiconductor device taken along line Z-Z in FIG. 18A after fabrication operations according to embodiments of the invention.

FIG. 20A depicts a cross-sectional view of the semiconductor device 1800 taken along line X-X in FIG. 18A after fabrication operations according to embodiments of the invention. FIG. 20B depicts a cross-sectional view of the semiconductor device 1800 shown in FIG. 18A taken along line Y-Y after fabrication operations according to embodiments of the invention. FIG. 20C depicts a cross-sectional view of the semiconductor device 1800 shown in FIG. 18A taken along line Z-Z according to embodiments of the invention.

The ILD material 1102 is formed on top of the semiconductor device 1800, and block mask 1104 is formed on top of the ILD material 1102 (analogous to FIGS. 11A, 11B, and 11C). To prepare for the future CA location, FIG. 20C shows CA location opening 2002 (analogous to FIG. 11C). Etching is performed to remove a portion of ILD 1102, remove a portion of the block mask 1104, and remove the (right) TS cap 1002 in FIG. 21C. The TS cap 1002 can be removed by selective RIE etching, thus leaving opening 2002. Removing the (right) TS cap 1002 exposes the (right) TS 118 in FIG. 20C.

FIG. 21A depicts a cross-sectional view of the semiconductor device 1800 taken along line X-X in FIG. 18A after fabrication operations according to embodiments of the invention. FIG. 21B depicts a cross-sectional view of the semiconductor device 1800 shown in FIG. 18A taken along line Y-Y after fabrication operations according to embodiments of the invention. FIG. 21C depicts a cross-sectional view of the semiconductor device 1800 shown in FIG. 18A taken along line Y-Y according to embodiments of the invention.

To open up the future CB location, FIG. 21B shows CB location opening 2102. Etching is performed to remove a portion of ILD 1102, remove a portion of the block mask 1104, and remove the SAC 120 for FIG. 12B. The SAC cap 120 can be removed by selective RIE etching, thus leaving CB opening 2102. The selective RIE etching exposes the gate metal 112 below. FIG. 21C shows that the future CA location opening 2002 in FIG. 20C has been filled back in with the block mask 1104, prior to forming CB opening 2102.

Figure 22A:
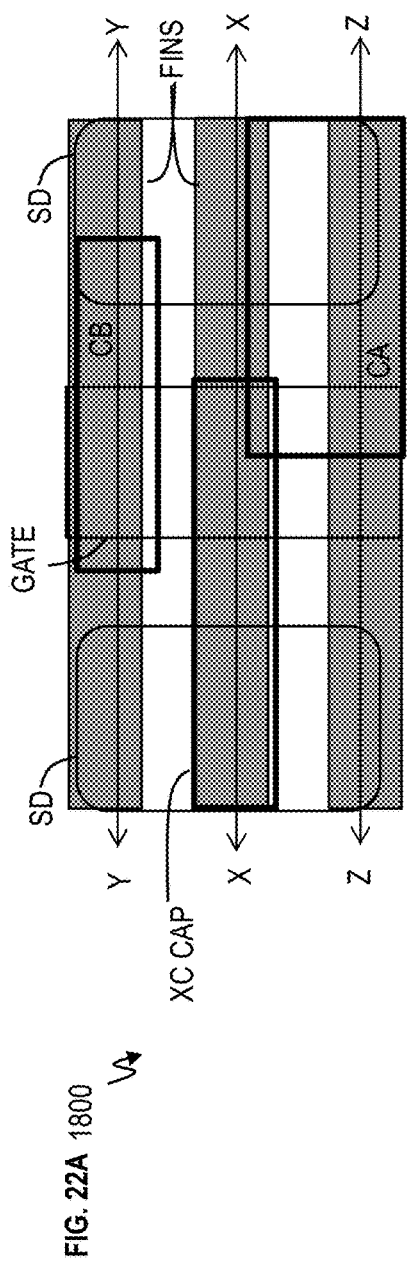
FIG. 22A depicts a simple diagram of a top view of the semiconductor device after fabrication operations according to embodiments of the invention.
Figure 22B:
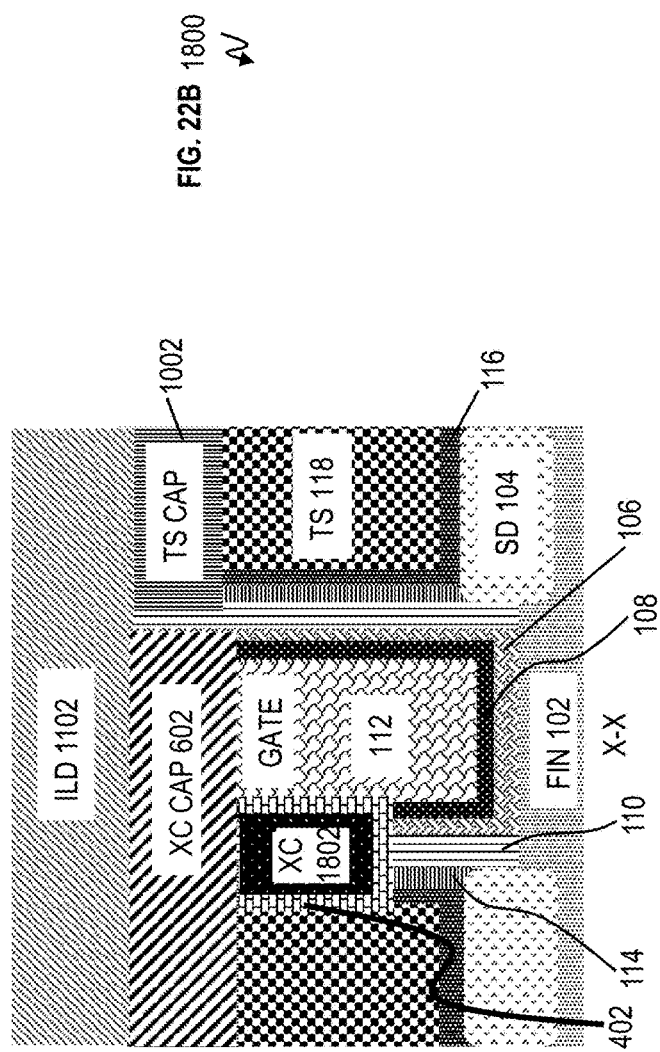
FIG. 22B depicts a cross-sectional view of the semiconductor device taken along line X-X in FIG. 22A according to embodiments of the invention.

FIG. 22A depicts a simple diagram of a top view of the semiconductor device 900 according to embodiments of the invention. For simplicity and ease of understanding, FIG. 22A omits layers (elements) so as to expose underlying layers. Also, FIG. 22A illustrates transparent layers (elements). In FIG. 22A, the local the S/D (CA) metal contact and the gate (CB) metal contact have been formed and are no longer dashed. FIG. 22B depicts a cross-sectional view of the semiconductor device 1800 taken along line X-X in FIG.

Figure 22C:
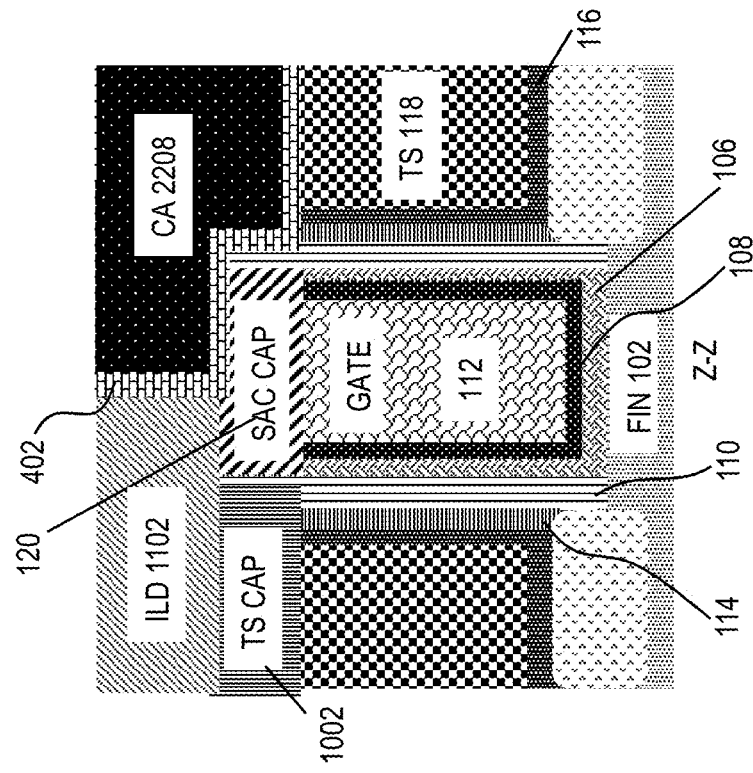
FIG. 22C depicts a cross-sectional view of the semiconductor device taken along line Y-Y in FIG. 22A according to embodiments of the invention.
Figure 22D:
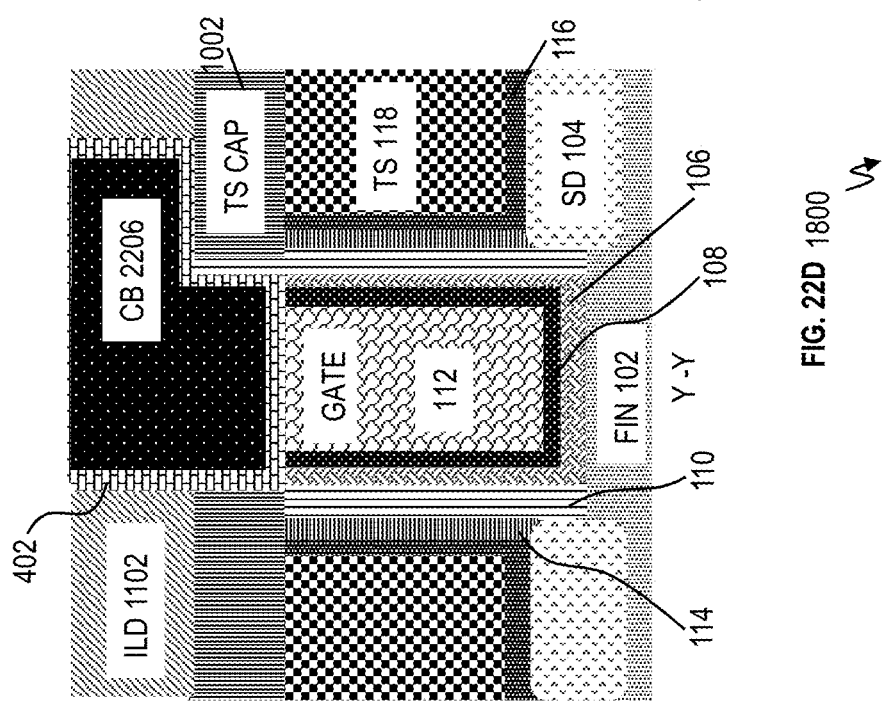
FIG. 22D depicts a cross-sectional view of the semiconductor device in FIG. 22A taken along line Z-Z according to embodiments of the invention.

22A according to embodiments of the invention. FIG. 22C depicts a cross-sectional view of the semiconductor device 1800 shown in FIG. 22A taken along line Y-Y according to embodiments of the invention. FIG. 22D depicts a cross-sectional view of the semiconductor device 1800 shown in FIG. 22A taken along line Z-Z according to embodiments of the invention.

All block masks 1104 are stripped, which reopens the previous CA location opening 2002 in FIG. 20C while the CB location opening 2102 is present in FIG. 21B. The metal liner 402 is deposited in the CA location opening 2002 (shown in FIG. 20C) and the CB location opening 2102 (shown in FIG. 21B). Metal is deposited on the metal liner 402 to form the CB metal contact 2206 (which is also referred to as the gate metal contact) as best seen in FIG. 22C and to form the CA metal contact 2208 (which is also referred to as S/D metal contact). The CB metal contact 2206 and CA metal contact 2208 can include materials of previous CA and CB metals discussed herein. From the simple diagram in FIG. 22A, the wide CA metal contact extends over the XC cap, while the XC cap covers/protects the XC local connection underneath (not seen in FIG. 22A). Particularly, the XC cap 602 in FIG. 22B prevents any electrical connection between the XC local connection 1802 and any contact such as CA metal contact 2208 above.

According to embodiments of the invention, the CB metal contacts and CA metal contacts are each isolated from the XC local connections.

According to embodiments of the invention, a method of forming a semiconductor device 900 is provided. The method includes forming a first (left) trench silicide (TS) 118 coupled to a first (left) source or drain (S/D) 104 and a second (right) TS 118 coupled to a second (right) S/D 104, and a gate metal 112 separated from the first and second TS 118. The method includes forming a trench 302 above and on sides of the gate metal 112 and forming a local connection metal (XC connection metal 404) in the trench such that the gate metal 112 is coupled to the first (left) TS 118 and the second (right) TS 118. The method includes forming a local connection cap 602 on top of the local connection metal 404.

The method can further include recessing the local connection metal into a first (left side) local connection metal 404 and a second (right side) local connection metal 404, prior to forming the local connection cap 602 on top of the local connection metal, as depicted in FIG. 7. The first (left) local connection metal 404 (electrically) couples the first (left) TS 118 to the gate metal 112. The second (right) local connection metal 404 (electrically) couples the second (right) TS 118 to the gate metal 112. Recessing the local connection metal into the first (left) local connection metal 404 and the second (right) local connection metal 404 removes the local connection metal from above the gate metal 112, as depicted in FIG. 7.

The local connection metal provides an electrical connection between the first TS 118, the second TS 118, and the gate metal 112, as depicted in FIG. 6.

The first (left) local connection metal provides an electrical connection between the first (left) TS 118 and the gate metal 112. The second (right) local connection metal 404 provides an electrical connection between the second (right) TS 118 and the gate metal 112. The method can further include depositing a metal liner 402 prior to the local connection metal 404 in the trench.

According to embodiments of the invention, a method of forming a semiconductor device 900 is provided. The method includes forming a first (left) trench silicide (TS) 118 coupled to a first (left) source or drain (S/D) 104, a second (right) TS 118 coupled to a second (right) S/D 104, a gate metal 112 separated from the first and second TS 118, and a local connection cap 120 over the gate metal 112. The method includes recessing the first and second TS 118 and forming a first (left) TS cap 1002 on the first (left) TS 118 and a second (right) TS cap 1002 on the second (right) TS 118, as depicted in FIGS. 10A, 10B, 10C. The method includes forming an inter-level dielectric (ILD) 1102 on top of the local connection cap 120, the first TS 118, and the second TS 118, and forming a local connection opening 1302 in FIG. 13A, a gate contact opening 1202 in FIG. 12B, and a S/D contact opening 1106 in FIG. 11C. The method includes depositing a local connection metal (e.g., XC local connection metal 1404) in the local connection opening, a gate metal contact 1406 in the gate contact opening, and a S/D metal contact 1408 in the S/D contact opening, wherein the local connection metal, the gate metal contact, and the S/D metal contact are separate from each other.

The local connection metal (electrically) couples the first (left) TS 118 to the gate metal 112 over a first fin (middle fin FIG. 14A) of the semiconductor device 90. The gate metal contact 1406 (electrically) couples to the gate metal 112 without coupling to the first and second TS 118 over a second fin (e.g., top fin in FIG. 14A) of the semiconductor device 900. The S/D metal contact 1408 (electrically) couples to the second (right) TS 118 over a third fin (e.g., bottom fin in FIG. 14A) of the semiconductor device 900.

As depicted in FIG. 15B, the local connection metal couples the first TS 118, the second TS 118, and the gate metal 112 over a first fin (e.g., middle fin in FIG. 15A) of the semiconductor device 900. As depicted in FIG. 15C, the gate metal contact 1406 extends to the first (left) TS cap 1002, the second (right) TS cap 1002, and the gate metal 112 over a second fin (e.g., top fin in FIG. 15A) of the semiconductor device 900.

Also, the S/D metal contact 1408 includes portions, one (electrically) coupled to the first (left) TS 118 and another (electrically) coupled to the second (right) TS 118 over a third fin (the bottom fin in FIG. 16D) of the semiconductor device 900, as depicted in FIGS. 16A and 17A. As depicted in FIG. 17B, the local connection metal 1404 includes two portions, one (electrically) couples the first (left) TS 118 to the gate metal 112 and another (electrically) couples the second (right) TS 118 to the gate metal 112 over a first fin (e.g., middle fin in FIG. 17A) of the semiconductor device 900. As depicted in FIG. 17C, the gate metal contact 1406 extends to the first (left) TS cap 1002, the second (right) TS cap 1002, and the gate metal 112 over a second fin (top fin in FIG. 17A) of the semiconductor device 900. As depicted in FIG. 17D, the S/D metal contact 1408 includes two portions, one (electrically) coupled to the first (left) TS 118 and another (electrically) coupled to the second (right) TS 118 over a third fin (e.g., bottom fin in FIG. 17A) of the semiconductor device 900.

According to embodiments of the invention, a method of forming a semiconductor device 1800 is provided. The method includes providing a first (left) trench silicide (TS) 118 coupled to a first (left) source or drain (S/D) 104, a second (right) TS 118 coupled to a second (right) S/D 104, a local connection metal 1802 coupled to a gate metal 112 and the first (left) TS 118, and a local connection cap 602 over the gate metal. The method includes recessing the first and second TS 188 to form a first (left) TS cap 1002 on the first (left) TS 118 and a second (right) TS cap 1002 on the second (right) TS 118. The method includes forming ILD 1102 on top of the local connection cap, the first TS, and the second TS. The method includes forming a gate contact opening 2102 in FIG. 21B and a S/D contact opening 2002 in FIG. 20C. The method includes depositing a gate metal contact 2206 in the gate contact opening and a S/D metal contact 2208 in the S/D contact opening, wherein the local connection metal 1802 is separated from the S/D metal contact 2208 over a first fin (e.g., middle fin in FIG. 22A, where the XC cap is over the XC connection (not shown in FIG. 22A) in under the XC cap) of the semiconductor device 1800.

The gate metal contact 2206 is (electrically) coupled to the gate metal 112. The S/D metal contact 2208 is coupled to the second (right) TS 118).

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming a first trench silicide (TS) coupled to a first source or drain (S/D), a second TS coupled to a second S/D, and a gate metal separated from the first and second TS;
   forming a trench above and on sides of the gate metal;
   forming a local connection metal in the trench such that the gate metal is coupled to the first TS and the second TS; and
   forming a local connection cap on top of the local connection metal.

2. The method of claim 1 further comprising recessing the local connection metal into a first local connection metal and a second local connection metal, prior to forming the local connection cap on top of the local connection metal.

3. The method of claim 2, wherein the first local connection metal couples the first TS to the gate metal.

4. The method of claim 3, wherein the second local connection metal couples the second TS to the gate metal.

5. The method of claim 2, wherein recessing the local connection metal into the first local connection metal and the second local connection metal removes the local connection metal from above the gate metal.

6. The method of claim 1, wherein the local connection metal provides an electrical connection between the first TS, the second TS, and the gate metal.

7. The method of claim 3, wherein the first local connection metal provides an electrical connection between the first TS and the gate metal.

8. The method of claim 4, wherein the second local connection metal provides an electrical connection between the second TS and the gate metal.

9. The method of claim 1 further comprising depositing a metal liner prior to the local connection metal in the trench.

10. A method of forming a semiconductor device, the method comprising:
    forming a first trench silicide (TS) coupled to a first source or drain (S/D), a second TS coupled to a second S/D, a gate metal separated from the first and second TS, and a local connection cap over the gate metal;
    recessing the first and second TS;
    forming a first TS cap on the first TS and a second TS cap on the second TS;
    forming an inter-level dielectric (ILD) on top of the local connection cap, the first TS, and the second TS;
    forming a local connection opening, a gate contact opening, and a S/D contact opening; and
    depositing a local connection metal in the local connection opening, a gate metal contact in the gate contact opening, and a S/D metal contact in the S/D contact opening, wherein the local connection metal, the gate metal contact, and the S/D metal contact are separate from each other.

11. The method of claim 10, wherein the local connection metal couples the first TS to the gate metal over a first fin of the semiconductor device.

12. The method of claim 11, wherein the gate metal contact couples to the gate metal without coupling to the first and second TS over a second fin of the semiconductor device.

13. The method of claim 11, wherein the S/D metal contact couples to the second TS over a third fin of the semiconductor device.

14. The method of claim 10, wherein:
    the local connection metal couples the first TS, the second TS, and the gate metal over a first fin of the semiconductor device;
    the gate metal contact extends to the first TS cap, the second TS cap, and the gate metal over a second fin of the semiconductor device; and
    the S/D metal contact comprises two portions, one coupled to the first TS and another coupled to the second TS over a third fin of the semiconductor device.

15. The method of claim 10, wherein:
    the local connection metal comprises two portions, one couples the first TS to the gate metal and another couples the second TS to the gate metal over a first fin of the semiconductor device;

the gate metal contact extends to the first TS cap, the second TS cap, and the gate metal over a second fin of the semiconductor device; and the S/D metal contact comprises two portions, one coupled to the first TS and another coupled to the second TS over a third fin of the semiconductor device.

16. The method of claim 10, further comprising depositing a metal liner prior to depositing the local connection metal, the gate metal contact, and the S/D metal contact.

17. A method of forming a semiconductor device, the method comprising:

providing a first trench silicide (TS) coupled to a first source or drain (S/D), a second TS coupled to a second S/D, a local connection metal coupled to a gate metal and the first TS, and a local connection cap over the gate metal;

recessing the first and second TS to form a first TS cap on the first TS and a second TS cap on the second TS;

forming an inter-level dielectric (ILD) on top of the local connection cap, the first TS, and the second TS;

forming a gate contact opening and a S/D contact opening; and depositing a gate metal contact in the gate contact opening and a S/D metal contact in the S/D contact opening, wherein the local connection metal is separated from the S/D metal contact over a first fin of the semiconductor device.

18. The method of claim 17, wherein the gate metal contact is coupled to the gate metal.

19. The method of claim 17, wherein the S/D metal contact is coupled to the second TS.

20. The method of claim 17, further comprising depositing a metal liner prior to depositing the gate metal contact and the S/D metal contact.

* * * * *